US007161625B2

(12) United States Patent
Hori

(10) Patent No.: US 7,161,625 B2
(45) Date of Patent: *Jan. 9, 2007

(54) IMAGE PICKUP APPARATUS

(75) Inventor: Masashi Hori, Yokohama (JP)

(73) Assignee: Canon Kabushiki Kaishi, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/104,475

(22) Filed: Apr. 13, 2005

(65) Prior Publication Data

US 2005/0179144 A1 Aug. 18, 2005

Related U.S. Application Data

(62) Division of application No. 09/570,411, filed on May 12, 2000, now Pat. No. 6,947,089.

(30) Foreign Application Priority Data

May 14, 1999 (JP) ............... 11-134339
Aug. 27, 1999 (JP) ............... 11-242088

(51) Int. Cl.
  *H04N 5/228* (2006.01)
  *H04N 9/73* (2006.01)
(52) U.S. Cl. ............... 348/222.1; 348/322; 348/223.1
(58) Field of Classification Search ........... 348/220.1, 348/222.1, 312, 317, 322, 223.1, 655
See application file for complete search history.

(56) References Cited

U.S. PATENT DOCUMENTS 5,295,001 A * 3/1994 Takahashi ............... 358/482
5,825,511 A 10/1998 Hori et al. ............... 358/486
5,828,407 A * 10/1998 Suzuki ............... 348/312
6,515,703 B1 2/2003 Suzuki et al. ............... 348/317
6,559,889 B1 * 5/2003 Tanaka et al. ............... 348/299

FOREIGN PATENT DOCUMENTS

| JP | 62193776 | 8/1987 |
| JP | 7-93706 | 9/1989 |
| JP | 5211320 | 8/1993 |
| JP | 8009263 | 1/1996 |

* cited by examiner

*Primary Examiner*—Lin Ye
(74) *Attorney, Agent, or Firm*—Fitzpatrick, Cella, Harper & Scinto

(57) ABSTRACT

For preventing the blooming phenomenon, there is provided an image pickup apparatus comprising a solid-state image pickup device adapted for a first readout method in which plural pixels are added to be read and a second readout method in which plural pixels are not added; and a circuit for applying a predetermined substrate voltage common to the first and second readout methods in an exposure period of the solid-state image pickup device and applying a predetermined substrate voltage corresponding to each readout method of the solid-state image pickup device in a period from the end of exposure of the solid-state image pickup device to the start of transfer to the signal transfer channel.

16 Claims, 14 Drawing Sheets

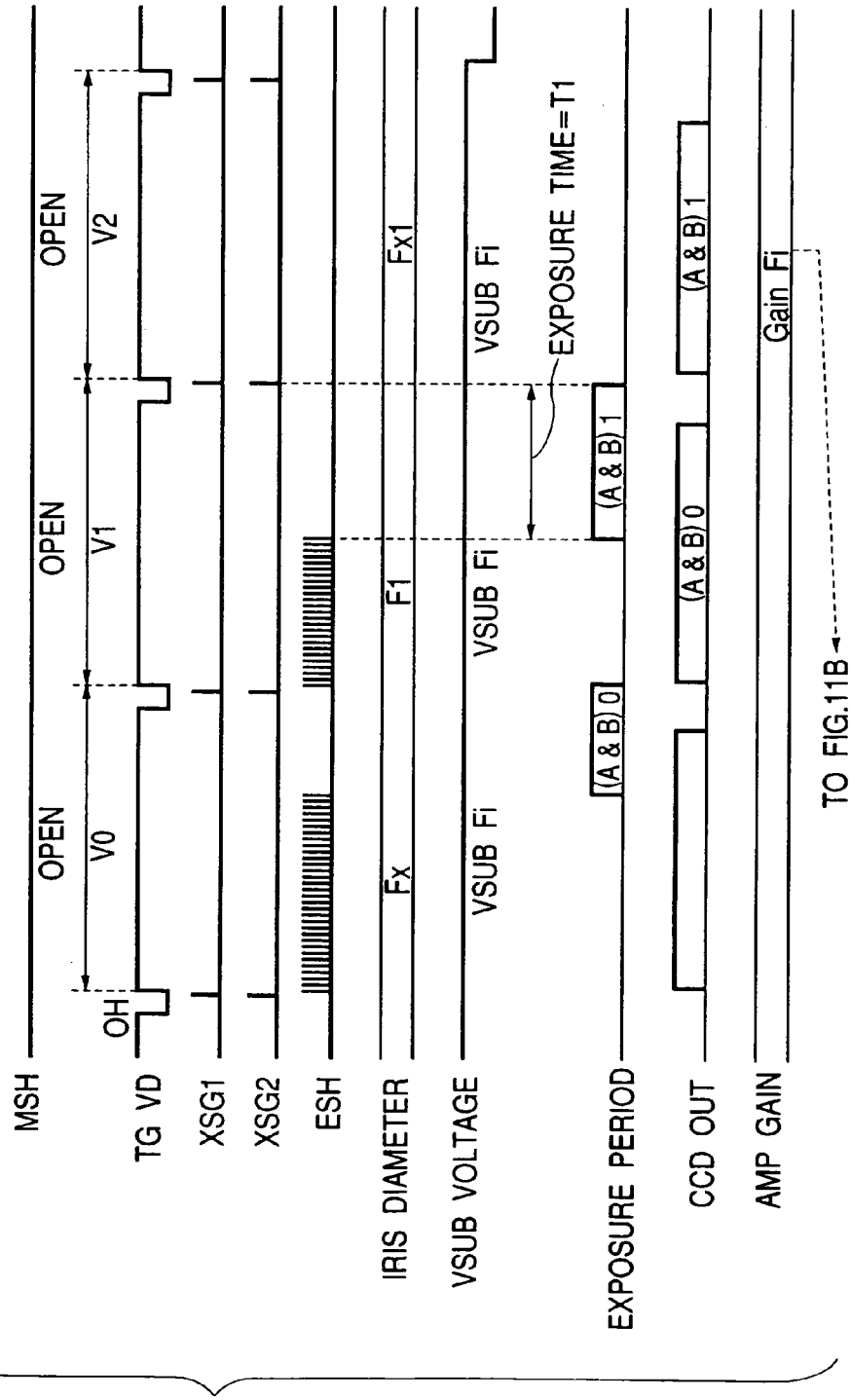

though the exposure is controlled by the exposure amount determined by the field reading method, it has been difficult to obtain an exposure matching the frame readout method. This causes particularly large influence in the still image taking in a dark condition by a digital still camera. The dark condition is, a portion or an entirely of a subject, a light condition of difficult to see when an image of the subject.

IMAGE PICKUP APPARATUS

This application is a division of U.S. application Ser. No. 09/570,411 filed on May 12, 2000 now U.S. Pat. No. 6,947,089, the entire content of which is incorporated herein by reference.

BACKGROUND OF THE INVENTION

1. Field of the Invention

The present invention relates to an image pickup apparatus for picking up an image of an object.

2. Related Background Art

In the image pickup apparatus constituted by a CCD (charge coupled device) there has conventionally been adopted a control method, as shown in FIGS. 1 to 3, of supplying the CCD with a field reading substrate voltage (VSUB) in case of field readout in which two pixels adjacent to each other in the vertical direction are added to be read, and with a frame reading substrate voltage in case of frame readout in which the pixels in the vertical direction are read one by one without adding of two pixels.

In another control method, the substrate voltage supplied to the CCD is maintained same both in the frame readout and the field readout.

An example of changing the substrate voltage for the two scanning method is disclosed in the Japanese Patent Publication No. 7-93706.

FIG. 4 is a cross-sectional view of a unit pixel of a CCD disclosed in the Japanese Patent Publication No. 7-93706, wherein shown are a photodiode (PD) 71, a transfer gate area 72, a ½-step vertical transfer CCD (V-CCD) 81, a P-well 82, a channel stop 83, an n-type substrate (n-SUB) 84, an inverse bias voltage (VSUB) 85 applied between the P-well and the n-substrate, and incident light 86. In this unit pixel, there is adopted a transfer gateless electrode configuration in which the V-CCD and the transfer gate area are driven by a common transfer electrode.

The Japanese Patent Publication No. 7-93706 discloses switching the inverse bias voltage (substrate voltage) VSUB between a first scanning method of reading the entire image area in a field period by simultaneously reading the signals of two adjacent horizontal pixel rows by one horizontal scanning and a second scanning method of scanning the entire image area in two fields (one frame) period by reading a signal of a horizontal pixel row by one horizontal scanning of the interlaced scanning method.

However, in the CCD constituting the image pickup apparatus, a change in the substrate voltage varies the peak value of the barrier potential for charge to be discarded toward the substrate. A higher substrate voltage shifts the peak value of the potential shallower, thereby reducing the charge amount that can be accumulated in each pixel. A lower substrate voltage shifts the peak value of the potential deeper, thereby increasing the charge amount that can be accumulated in each pixel. Also a shift of the peak position of the potential to the shallower side reduces the sensitivity to red colored light of longer wavelength, and a shift of the peak position to the deeper side increases the sensitivity to red colored light of longer wavelength.

In consideration of the above-described property of CCD, in order to obtain a substrate voltage suitable for the field signal readout in which the two pixels are added in the vertical transfer channel (signal transfer channel) of CCD, it is necessary to elevate the substrate voltage thereby obtaining a shallower peak value of the barrier potential to reduce the saturation accumulated charge amount per pixel, whereby the charge amounts of two pixels at the addition thereof in the vertical transfer channel do not exceed the saturation charge amount of the vertical transfer channel. If such substrate voltage suitable for field signal readout is applied to the frame signal readout, the saturation level of the CCD output becomes lower because the saturation accumulated charge amount per pixel is made smaller, whereby the dynamic range becomes narrower.

On the other hand, if the substrate voltage is lowered for the frame signal readout, thereby shifting the peak of the barrier potential to the deeper side and increasing the accumulated charge amount per pixel and if such substrate voltage is used in the field signal readout, the charge amount of the two pixels at the addition thereof in the vertical transfer channel may exceed the saturation charge amount thereof, thus resulting a blooming phenomenon caused by the overflowing of the charge into the signal of other pixels.

The limited dynamic range and the blooming phenomenon mentioned above can be avoided by the use of the substrate voltages respectively matching the field signal readout and the frame signal readout, while the spectral sensitivity becomes different between the field signal readout and the frame signal readout because of the difference in the substrate voltage, whereby the color reproducibility and the luminance level of the finally obtained image change.

Also in the conventional CCD, in addition to the control method of supplying the CCD with a field reading substrate voltage in case of field readout in which two pixels adjacent to each other in the vertical direction are added and read, and with a frame reading substrate voltage in case of frame readout in which pixels in the vertical direction are read one by one without adding of adjacent two pixels, the sensitivity of the field reading method at the CCD reading is assumed to be twice of that of the frame reading method, and the exposure for obtaining a still image in the frame image readout is controlled by the field readout method, based on the exposure amount detected by the field reading method and on the assumption that the sensitivity of the frame readout method is ½ of that of the field readout method.

FIG. 5A is a cross-sectional view of a CCD, and FIG. 5B is a view showing the electronic potential in the horizontal and vertical directions along a broken line 5B–5B in FIG. 5A. In FIG. 5A, there are shown an n-type semiconductor substrate 21, a p-type first semiconductor area 22, an n-type photoelectric converting element area 23, an n-type channel area 24 of a vertical charge transfer element having an o2 area, a p-type channel stop area 25, a transfer electrode 26 of a vertical charge transfer element adapted to transfer the photoelectrically converted charge of the n-type channel area of the o2 area at a potential d and to intercept such charge at a potential e, and a power supply 27 for applying a substrate voltage (VSUB) to the n-type semiconductor substrate 21.

Referring to FIG. 5A, if the substrate voltage (VSUB), applied to the n-semiconductor substrate 21 through the power supply 27 is lowered from a voltage corresponding to a barrier a in the CCD as shown in FIG. 5B, the barrier tends to increase as indicated by b in FIG. 5B. This barrier inhibits the migration of the charge accumulated by photoelectric conversion in an area o1, toward an area o3. On the other hand, increase in the substrate voltage facilitates the electron flow as indicated by c. Thus, increase in the substrate voltage shifts the peak of the barrier to a shallower position as indicated by a to c, whereby the charge amount that can be accumulated in each pixel decreases. On the other hand, decrease in the substrate voltage shifts the peak of the barrier to a deeper position as indicated by a to b, whereby the charge amount that can be accumulated in each pixel increases.

Such shift of the potential peak position toward the shallower position, caused by the lower voltage applied to the substrate, decreases the sensitivity to the light of longer wavelength or red color region, while the shaft toward the deeper position, caused by the higher voltage applied to the substrate, increases the sensitivity to the light of longer wavelength or red color region.

If a pulse-shaped voltage (ESH) is applied to the n-semiconductor substrate 21, the barrier shifts from a to c, whereby all the charge in the area o1 can be transferred to the area o3. Such function can be utilized to arbitrarily set the start time of charge accumulation in the area o1, and such pulse-shaped voltage is called an electronic shutter.

In consideration of the above-described property of CCD, in order to optimize the substrate voltage to the field readout in which two pixels are added in the vertical transfer channel of the CCD, it is necessary to elevate the substrate voltage, thereby realizing a shallower potential peak and decreasing the saturation accumulated charge amount per pixel, whereby the charge amount of the two pixels does not exceed the accumulation charge amount of the vertical transfer channel at the addition of two pixels therein. If the substrate voltage optimized to the field readout is used in the frame readout, there is raised a problem that a saturation-CCD output is smaller, since such the substrate voltage is set to provide smaller saturation accumulated charge amount per pixel.

On the other hand, if the substrate voltage is lowered for optimization for the frame readout, thereby shifting the potential peak deeper and increasing accumulated charge amount per pixel, and if such substrate voltage is used for the field readout, the charge amount of two pixels at the addition thereof in the vertical transfer channel exceeds the accumulation charge amount thereof, and the overflowing charge is mixed with the charge of other pixel signals, thus causing so-called blooming phenomenon.

Based on these facts, the substrate voltage is switched to the optimum values respectively for the field readout and the frame readout.

In picking up a still image of the frame readout method with the above-described control of the substrate voltage, the exposure conditions such as the exposure time and the diaphragm aperture for the still image are determined by a signal read out in the field readout method. In the determination of such exposure conditions, it is assumed that the signal amplitude in the field readout method, in which two pixels are added in the CCD, is twice of that in the frame readout method in which the signal is read pixel by pixel. However, in such drive control, the substrate voltage in the frame readout method is different from and is lower than that in the field readout method whereby the potential peak is the CCD is deeper and the sensitivity becomes higher for the long-wavelength red color region. The image obtained by the frame readout therefore shows a difference in the luminance, corresponding to the difference in the sensitivity in the long-wavelength region, from the exposure conditions determined in the field readout method, whereby the image of the optimum luminance cannot be obtained.

Also the color reproducibility of the image becomes different between the field readout method and the frame readout method, because of the change in the sensitivity of the CCD in the longer wavelength region.

SUMMARY OF THE INVENTION

The object of the present invention is, in using an image pickup apparatus in different operation modes, to obtain a satisfactory image in any of these operation modes.

The above-mentioned object can be attained, according to aspect of the present invention, by presenting an image pickup apparatus comprising a solid-state image pickup device adapted for use both in a first readout method in which plural pixels are added to be read out and in a second readout method in which plural pixels are not added, and means for applying a predetermined substrate voltage during the exposure period of the solid-state image pickup device, in the first and second readout methods in common and applying a substrate voltage corresponding to each of the readout methods of the solid-state image pickup device in a period from the end of the exposure period to the start of the charge transfer to a signal transfer channel.

According to another aspect of the present invention, there is provided an image pickup apparatus comprising:
a solid-state image pickup device;
substrate voltage application means for applying plural different substrate voltages to the solid-state image pickup device; and
color change suppression means for suppressing the color change resulting from control of the substrate voltage by the substrate voltage application means.

According to another aspect of the present invention, there is provided an image pickup apparatus comprising:
a solid-state image pickup device for converting light into an electric signal;
substrate voltage application means for applying plural different substrate voltages to the solid-state image pickup device;
control means for controlling a first operation mode with application of a first substrate voltage and a second operation mode with application of a second substrate voltage;
memory means for storing the difference between sensitivity of the solid-state image pickup device in the first operation mode and that in the second operation mode; and
adjustment means for executing adjustment for image pickup, utilizing the sensitivity difference stored in the memory means.

According to still another aspect of the present invention, there is provided an image pickup apparatus comprising:
a solid-state image pickup device for converting light into an electric signal;
substrate voltage application means for applying plural different substrate voltages to the solid-state image pickup device;
control means for controlling a first operation mode with application of a first substrate voltage and a second operation mode with application of a second substrate voltage;
memory means for storing the difference between sensitivity of the solid-state image pickup device in the first operation mode and that in the second operation mode; and
signal process means for executing a color signal process on the output signal of the solid-state image pickup device, utilizing the sensitivity difference stored in the memory means.

According to another aspect of the present invention, there is provided an image pickup apparatus comprising:
a solid-state image pickup device for converting light into an electric signal;
substrate voltage application means for applying plural different substrate voltages to the solid-state image pickup device;

control means for controlling a first operation mode with application of a first substrate voltage and a second operation mode with application of a second substrate voltage; and signal process means for executing, on the output signal of the solid-state image pickup device, different color signal processings in the first operation mode and in the second operation mode respectively.

According to another aspect of the present invention, there is provided an image pickup apparatus comprising:

a solid-state image pickup device having plural color filters;

substrate voltage application means for applying plural different substrate voltages to the solid-state image pickup device;

control means for controlling a first operation mode with application of a first substrate voltage, among the plural different substrate voltages, to the solid-state image pickup device and a second operation mode with application of a second substrate voltage to the solid-state image pickup device; and white balance means for adjusting the white balance of the image signal outputted from the solid-state image pickup device in the first and second operation modes;

wherein the white balance means includes detection means for detecting a ratio of color components in the output signal of the solid-state image pickup device and setting means for setting a white extraction range with respect to the ratio of the color components, and wherein a first white extraction range is set in case the solid-state image pickup device is operated in the first operation mode, and a second white extraction range is set in case the solid-state image pickup device is operated in the second operation mode.

According to another aspect of the present invention, there is provided an image pickup apparatus comprising:

a solid-state image pickup device having plural color filters;

substrate voltage application means for applying plural different substrate voltages to the solid-state image pickup device; and control means for controlling a first operation mode with application of a first substrate voltage, among the plural different substrate voltages, to the solid-state image pickup device and a second operation mode with application of a second substrate voltage; and signal process means for generating a luminance signal and two chrominance signals from the image signal outputted from the solid-state image pickup device in the first and second operation modes;

wherein the signal process means includes color hue adjustment means capable of adjusting the color hue of the two chrominance signals by setting an adjustment value, and wherein a first color hue adjustment value is set in the color hue adjustment means in case the solid-state image pickup device is operated in the first operation mode, and a second color hue adjustment value is set in the color hue adjustment means in case the solid-state image pickup device is operated in the second operation mode.

Other objects of the present invention, and the features thereof, will become fully apparent from the following description to be taken in conjunction with the accompanying drawings.

DESCRIPTION OF THE PREFERRED EMBODIMENTS

In the following, the present invention will be described in detail by preferred embodiments, with reference to the attached drawings.

Figure 6:
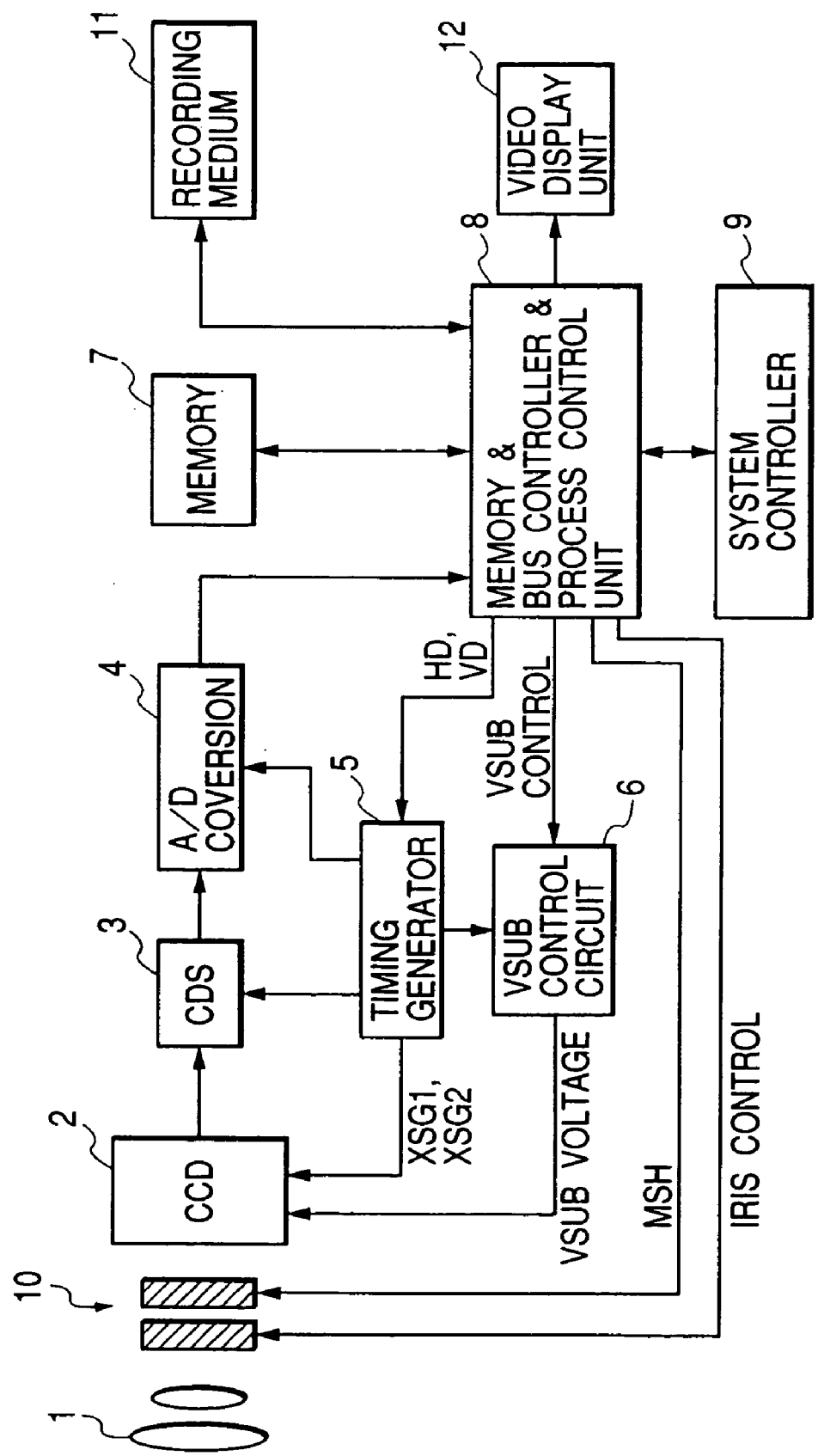
FIG. 6 is a block diagram showing an image pickup apparatus of embodiments 1 to 4.

FIG. 6 is a block diagram showing the configuration of an image pickup apparatus, to be employed in first to fourth embodiments to be explained later. In FIG. 6, there are shown a light condensing optical system 1; a CCD 2 constituting an image pickup element for converting the light, condensed by the optical system 1, into an electrical signal; a CDS circuit 3 for obtaining a desired signal component from the electrical signal outputted from the CCD 2; an AD converter 4 for converting the output signal of the CDS circuit 3 into a digital signal; a timing generator (TG) 5 for driving the CCD 2, CDS circuit 3 and AD converter 4 including CCD readout signals (XSG1, XSG2) and an electronic shutter signal (ESH); a VSUB control circuit 6 for supplying the CCD 2 with a substrate voltage (VSUB) and controlling the substrate voltage; a memory 7; a memory and bus controller/process circuit 8 for controlling the memory 7 and a bus, also supplying the TG 5 with horizontal and vertical sync signals (HD, VD), supplying the VSUB control circuit 6 with a substrate voltage control signal (Vsub_Control) and applying a predetermined process to the image signal from the AD converter 4 and the memory 7; a system controller 9 for controlling the entire system; a mechanical shutter 10 for introducing the light, condensed by the optical system 1, into the CCD 2 or intercepting such light; a recording medium 11 for recording the image signal from the CCD 2 after a predetermined process; and an image display unit 12 for displaying the image signal processed in the memory and bus controller/process circuit 8.

Figure 10A:
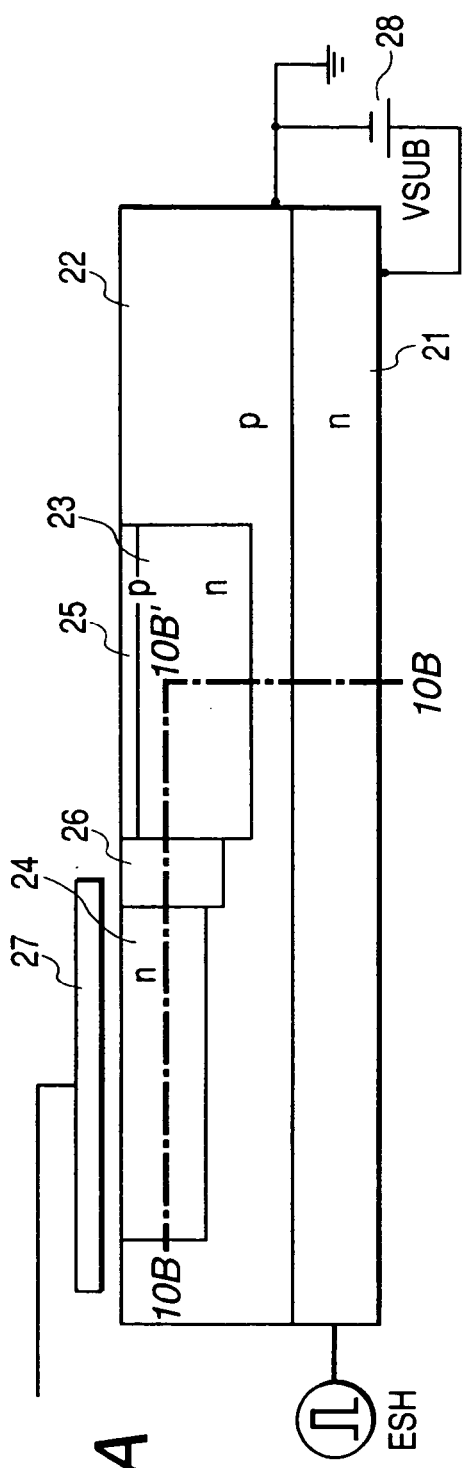
FIGS. 10A and 10B are respectively a cross-sectional view showing the schematic configuration of the CCD and a potential chart showing the potential of the CCD in the horizontal and vertical directions.
Figure 10B:
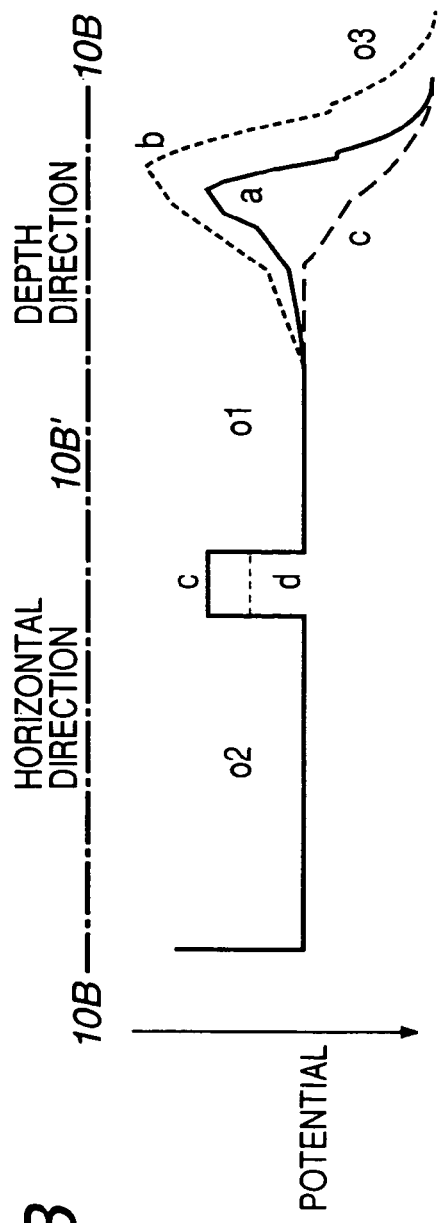

FIG. 10A is a schematic cross-sectional view showing the configuration of the above-described CCD 2, and FIG. 10B is a view showing the potential of the CCD 2 in the horizontal and vertical directions.

Figure 1:
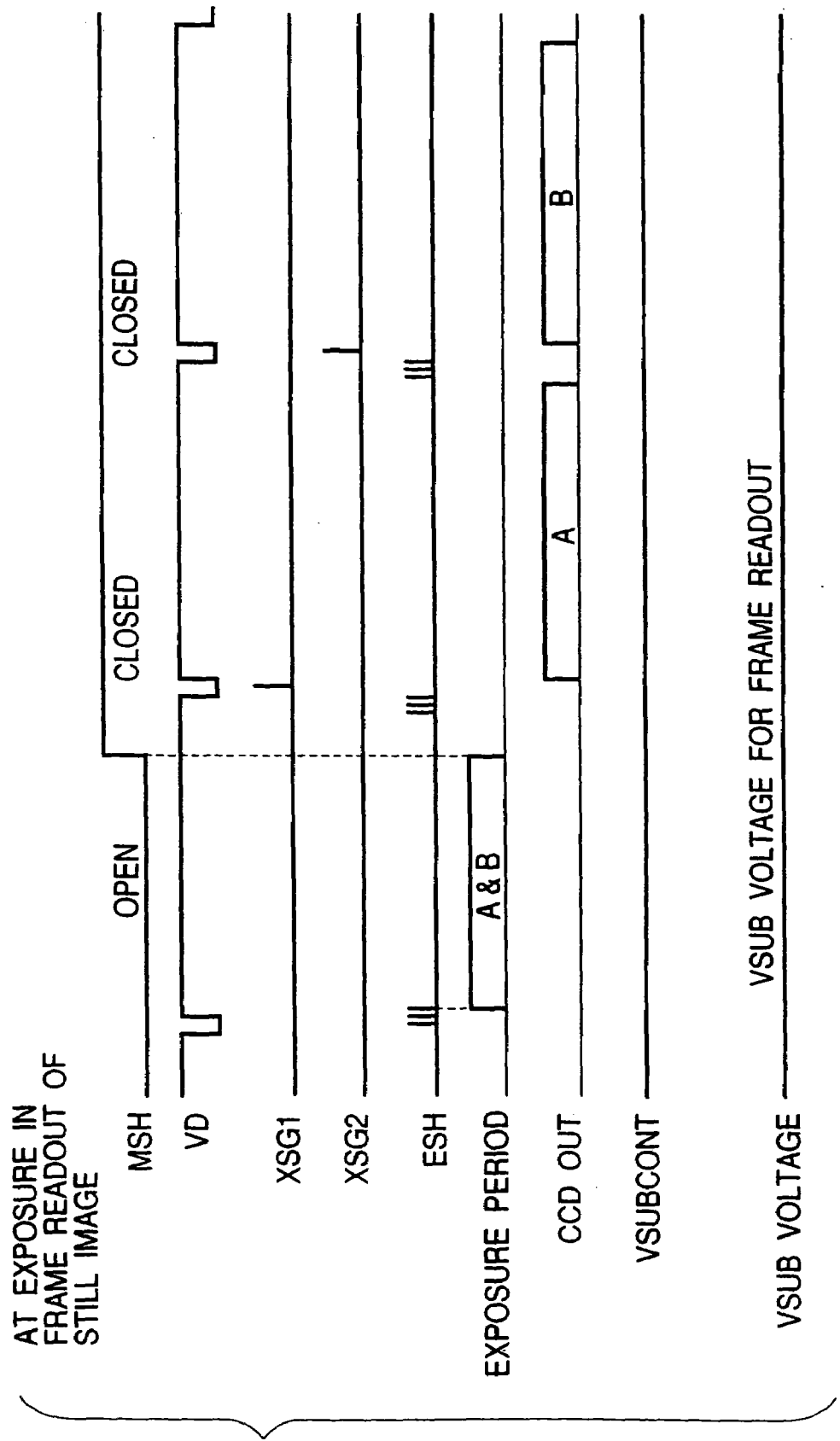
FIGS. 1, 2 and 3 are charts showing the conventional control timing.
Figure 2:
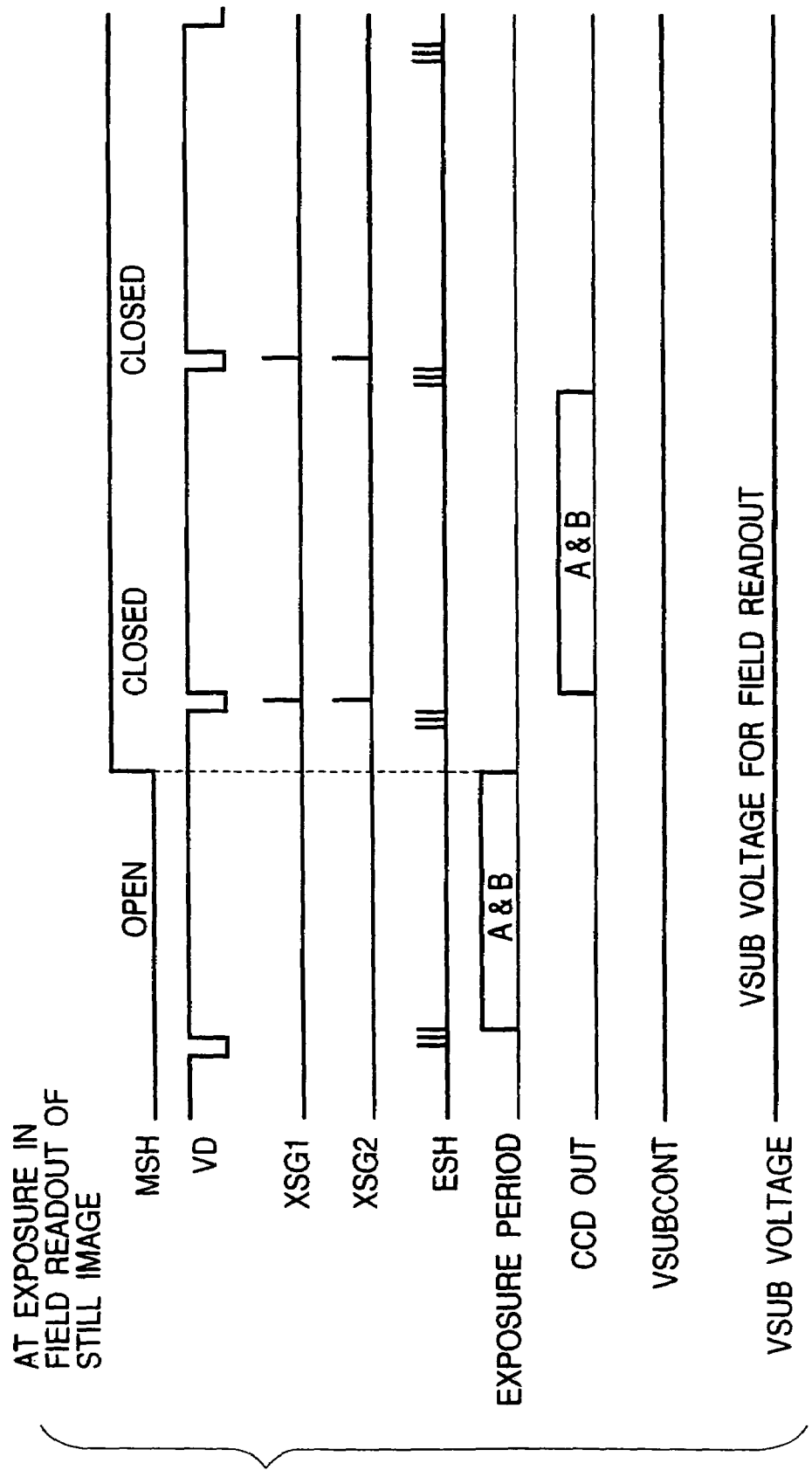
Figure 3:
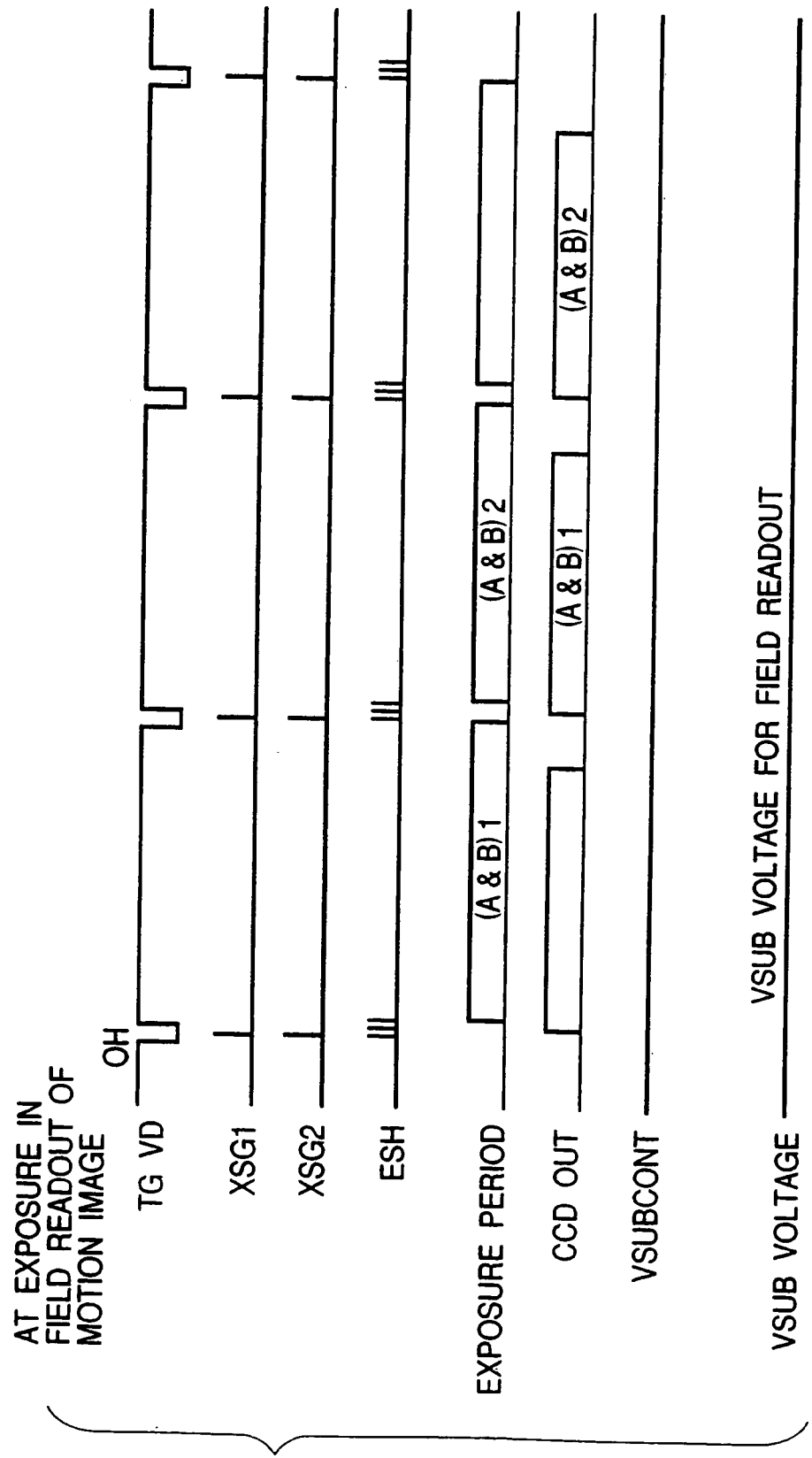
Figure 4:
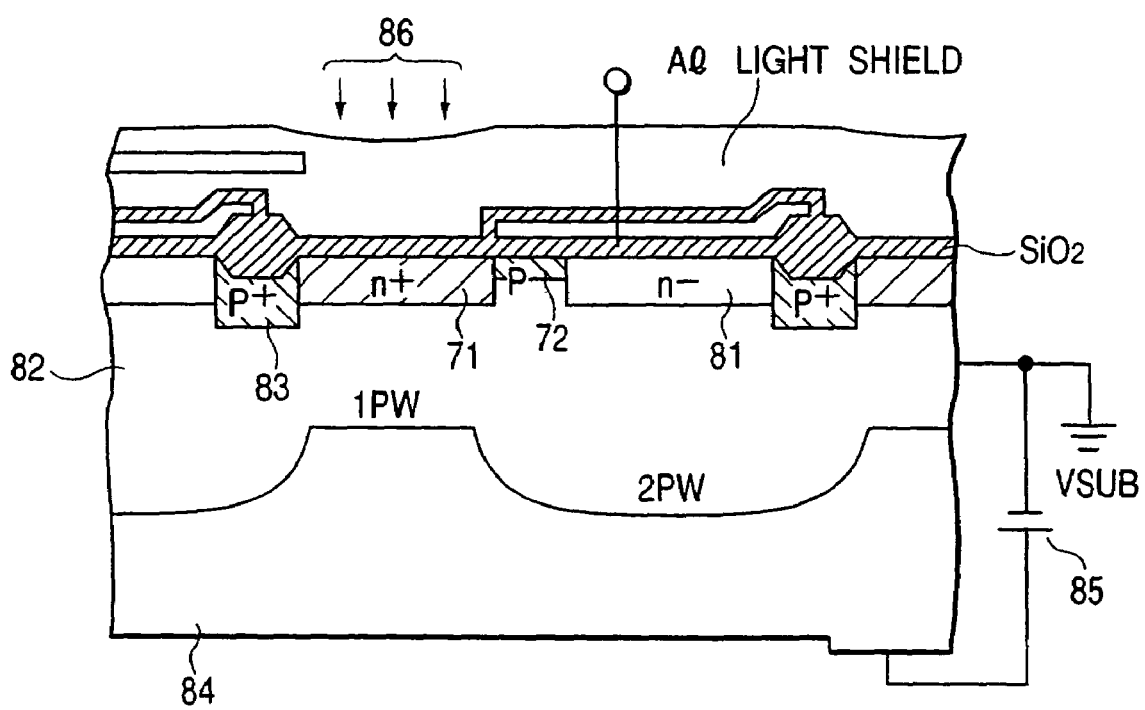
FIG. 4 is a cross-sectional view of a unit pixel of a CCD disclosed in the Japanese Patent Publication No. 7-93706.
Figure 5A:
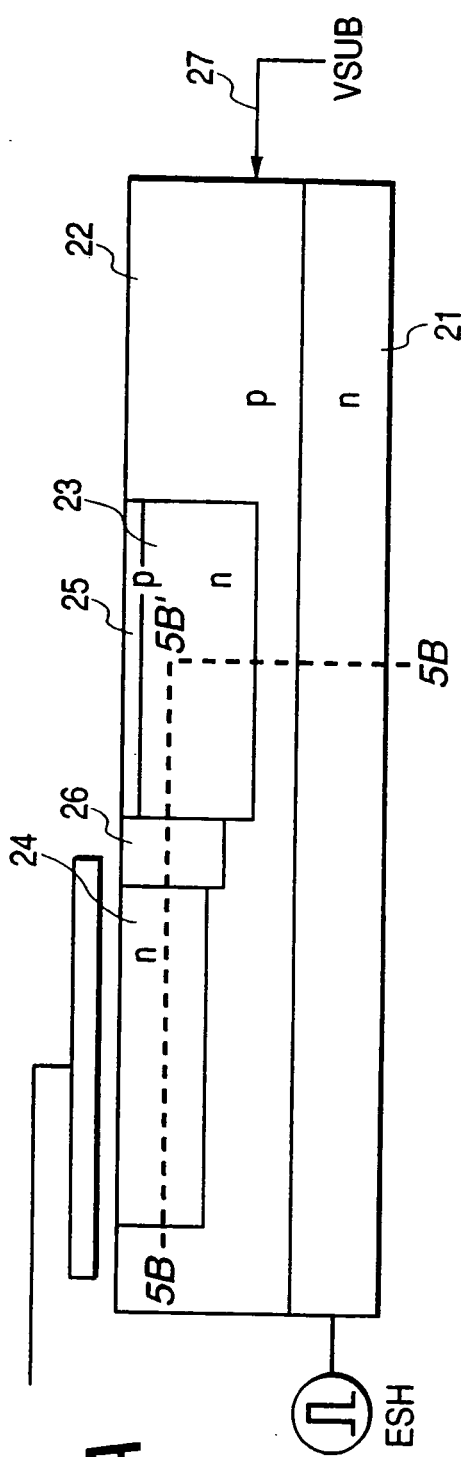
FIGS. 5A and 5B are views showing the structure and function of the CCD.
Figure 5B:
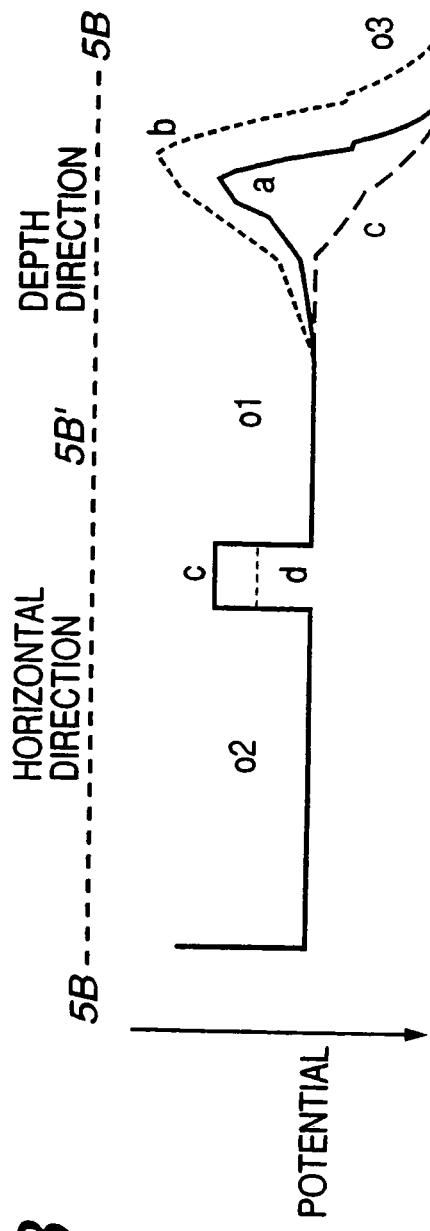

Referring to FIG. 10A, there are shown an n-type semiconductor substrate 21; a p-type semiconductor area 22; an n-type photoelectric conversion area 23; a channel area 24 of a vertical transfer CCD; a p-type channel stop area 25; a transfer gate area 26; and a transfer electrode 27. As shown in FIG. 4, there is adopted a transfer gateless electrode configuration in which the vertical transfer CCD and the transfer gate area are driven by a common transfer electrode. A power supply 28 is provided for providing the n-semiconductor substrate 21 with the substrate voltage (VSUB).

If the substrate voltage (VSUB) applied to the n-semiconductor substrate 21 by the power supply 28 is lowered from a substrate voltage corresponding to a barrier a in the CCD shown in FIG. 10B, the barrier tends to increase as indicated by b in FIG. 10B. This barrier inhibits the migration of the charge, accumulated by photoelectric conversion in an area o1, toward an area o3.

Also if a pulse-shaped voltage (ESH) is applied to the n-semiconductor substrate 21, the barrier shifts from a to c, whereby all the charge in the area o1 can be transferred to the area o3. Such function can be utilized to arbitrarily set the start time of charge accumulation in the area o1. Such pulse-shaped voltage is called an electronic shutter, and means for providing such pulse-shaped voltage is called electronic shutter means.

In the following there will be explained a first embodiment of the present invention. The function of the above-described image pickup apparatus will be explained with reference to FIGS. 7 and 8, which are timing charts showing the function of the image pickup apparatus.

In case of the exposing of the still image in the frame readout mode, the mechanical shutter 10 is opened and the exposure is started at the output (T11) of the electronic shutter (ESH), and the exposure of the CCD 12 is completed when the mechanical shutter 10 is closed (T12). Then the charges of the pixels are read by the frame readout mode by the readout signals XSG1, XSG2, and the pixel data are stored in the memory 7, then subjected to a predetermined process and recorded on the recording medium 11.

In case of the exposing of the still image in the field readout mode, the mechanical shutter 10 is opened and the exposure is started at the output (T21) of the electronic shutter (ESH), and the exposure of the CCD 12 is completed when the mechanical shutter 10 is closed (T22). Then the charges of the pixels are read by the frame readout mode by adding vertically arranged two pixels by the readout signals XSG1, XSG2, and the pixel data are stored in the memory 7, then subjected to a predetermined process and recorded on the recording medium 11.

Figure 7:
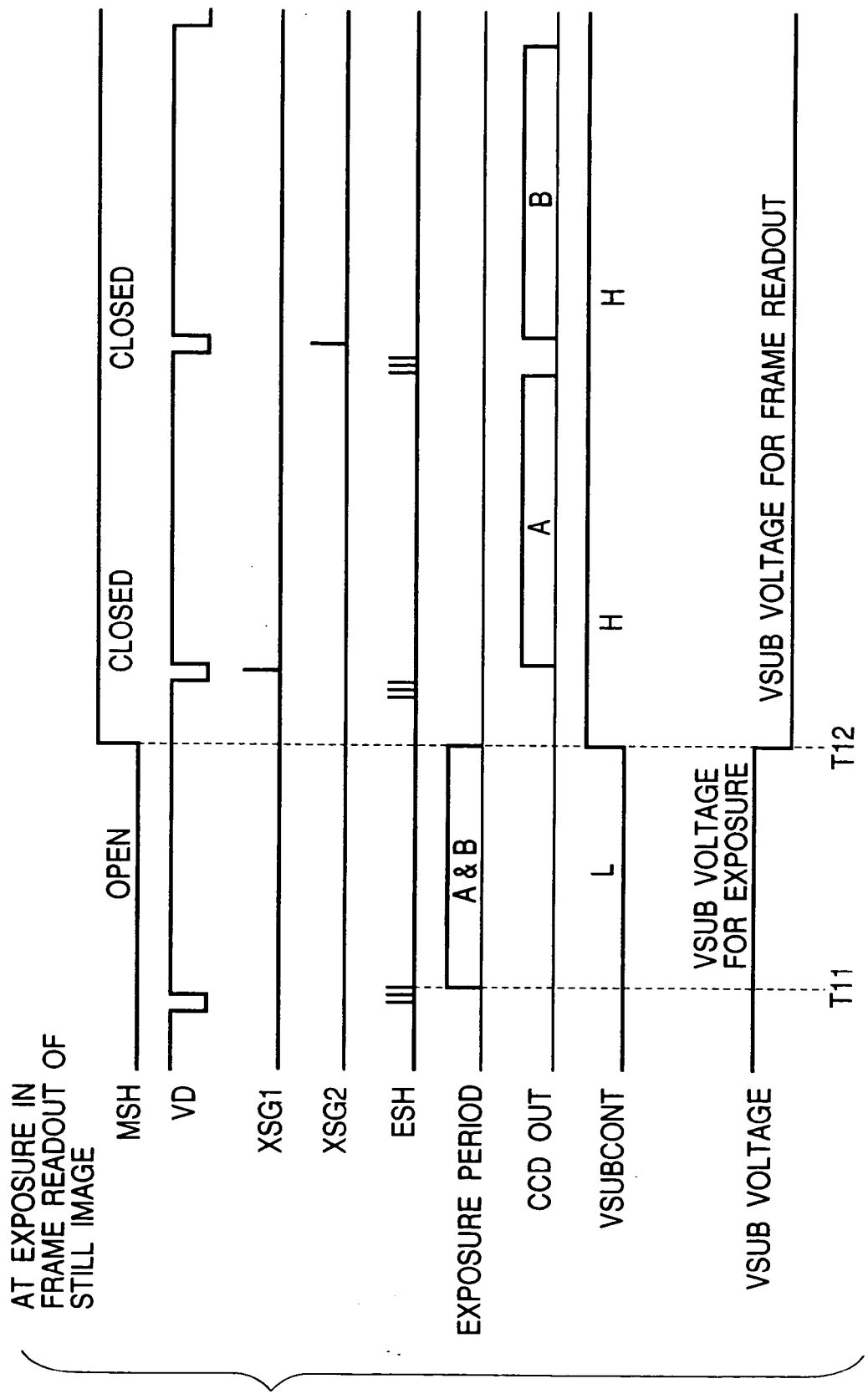
FIGS. 7 and 8 are charts showing the control timing in a first embodiment of the present invention.

In case of the exposing of the still image in the frame readout mode, prior to the start of exposure of the CCD (before T11), the memory and bus controller/process circuit 8 sets the Vsub_Control signal at the L-level state as shown in FIG. 7 thereby causing the VSUB control circuit 6 to supply the CCD 2 with an exposure VSUB. The memory and bus controller/process circuit 8 closes the mechanical shutter 10 by MSH thereby terminating the exposure of the CCD 2 (T12). In synchronization with the termination of exposure, the Vsub_Control signal is shifted to the H-level state to cause the VSUB control circuit 6 to supply the CCD 2 with a frame readout VSUB. This frame readout VSUB is set to be same as or lower than the exposure VSUB set during the exposure period.

Figure 8:
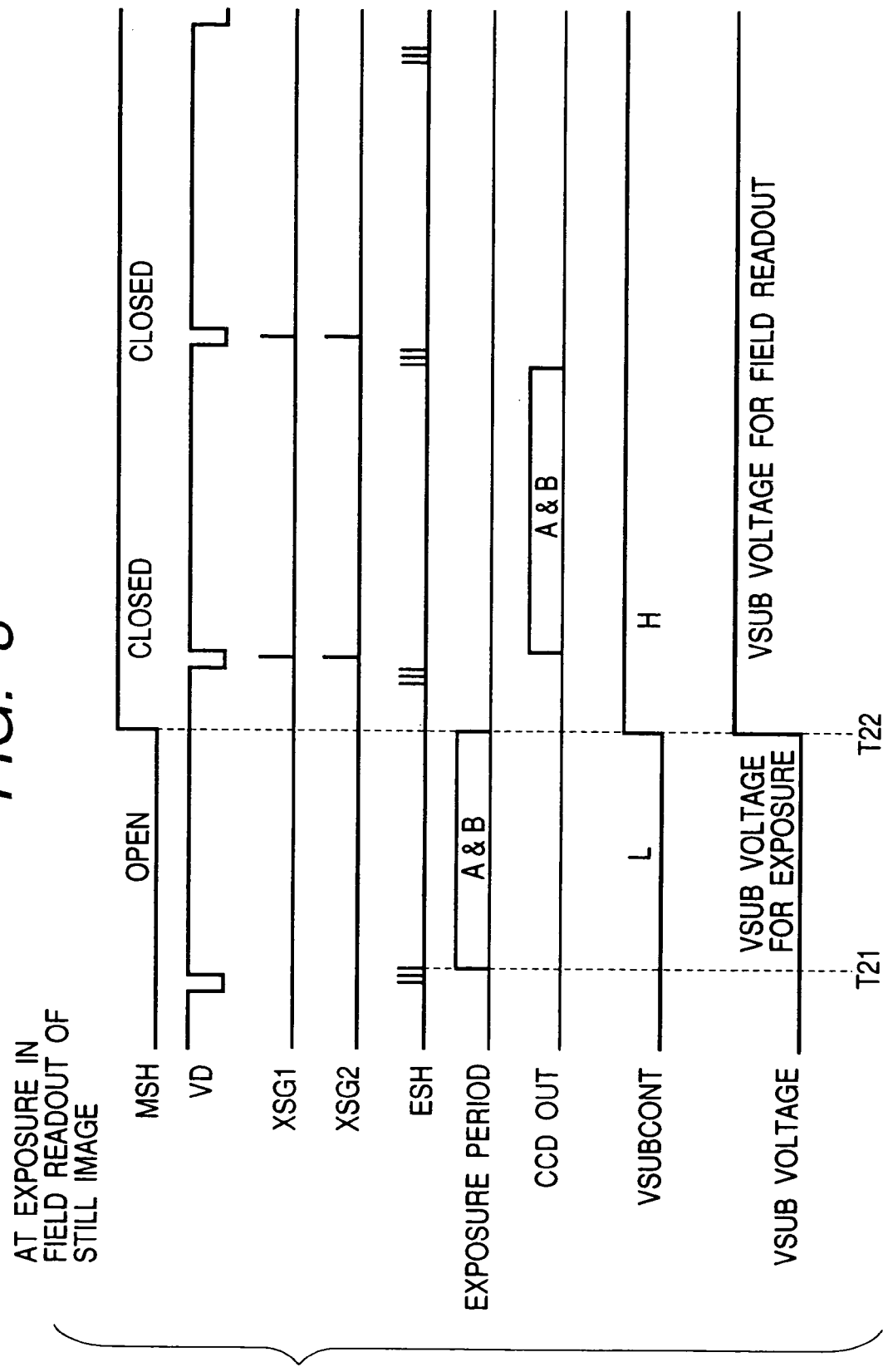

In case of the exposing of the still image in the field readout mode, prior to the start of exposure of the CCD (before T21), the memory and bus controller/process circuit 8 sets the Vsub_Control signal at the L-level state as shown in FIG. 8 thereby causing the VSUB control circuit 6 to supply the CCD 2 with an exposure VSUB. The memory and bus controller/process circuit 8 closes the mechanical shutter 10 by MSH thereby terminating the exposure of the CCD 2 (T22). In synchronization with the termination of exposure, the Vsub_Control signal is shifted to the H-level state to cause the VSUB control circuit 6 to supply the CCD 2 with a field readout VSUB. This field readout VSUB is set to be same as or higher than the exposure VSUB set during the exposure period.

As explained in the foregoing, the substrate voltage supplied to the CCD constituting the image pickup element is made as a common voltage (exposure VSUB) in the exposure period (T11 to T12, T21 to T22) prior to the field or frame readout operation, in order to prevent generation of difference in the spectral sensitivity, whereby the color reproducibility and the luminance level can be made same in the field readout and the frame readout. Then, in the period from the end of exposure to the end of CCD readout, there is adopted a VSUB suitable for the field readout or the frame readout (field readout VSUB or frame readout VSUB), whereby, in the field readout mode, the charge exceeding the saturation accumulated charge amount of the vertical transfer channel can be discarded to the CCD substrate prior to the transfer to the vertical transfer channel to prevent the blooming phenomenon, and, in the frame readout mode, the saturation CCD output can be made large.

In the present embodiment, the VSUB control circuit also functions as the color change suppression means by applying a substrate voltage common to the frame readout and the field readout during the exposure time and applying a substrate voltage matching the readout mode during the readout period.

In the following there will be explained a second embodiment of the present invention.

In case of the exposing of the moving image in the field readout mode, the field readout operation is executed continuously on the CCD 2, and the obtained signal is processed by the memory and bus controller/process circuit 8 and displayed on the image display means 12 and stored on the recording medium, and the image signal is further processed to obtain data necessary for the system control.

In case of the exposing of the moving image in the field readout mode, the mechanical shutter 10 is constantly open and the exposure period (E1, E2, E3) of the CCD 2 is defined from the output of the electronic shutter to the output of the readout signal (XSG1, XSG2). Also the readout period of the exposed image signal from the CCD 2 starts after a predetermined time from the output of the readout signal (XSG1, 2) and ends by the lapse of horizontal scanning periods of the number of the pixel lines of the CCD 2 (indicated by CCD OUT in FIG. 4). As shown in FIG. 4, the end of the exposure time is defined by the readout signal (XSG1, 2) supplied to the CCD. In case the time interval between the end of exposure to the start of readout is none or short, the memory and bus controller/process circuit 8 shifts the Vsub_Control signal to the L-level state during a period from the output (T1) of the readout signal (XSG1, 2) for the CCD 2 to the end (T2) of the readout period of the exposed image signal from the CCD 2 as shown in FIG. 4, thereby causing the VSUB control circuit 6 to supply the CCD 2 with the exposure VSUB in order to obtain a spectral sensitivity same as that for the frame readout still image and the field readout still image.

Then there is set a timing (T3) for shifting the Vsub_Control signal to the H-level state within a period from the end (T2) of the image signal readout period to the output (T1) of the next readout signal (XSG1, 2) for the CCD 2, and a field readout VSUB is supplied to the CCD 2 by the VSUB control circuit 6 during a period from (T3) to (T1) in order to prevent the blooming phenomenon caused by overflowing the charge in the vertical transfer channel.

The timing (T3) of shifting the Vsub_Control signal to the H-level state is so selected that the ratio among the exposure time (E1, E2, E3) determined by the electronic shutter (ESH), the period of the H-level state of the Vsub_Control signal and the supply period (F1, F2, F3) of the field readout VSUB voltage becomes constant.

Thus, in case of setting plural substrate voltages during the exposure time, there is maintained a constant ratio between the exposure time and the set period of a substrate voltage to obtain a constant sensitivity and a constant spectral sensitivity for the image signal to be read from the CCD even under the exposure time control according to the change in the object luminance, and to reduce the difference in the spectral sensitivity between the frame readout still image and the field readout still image.

Figure 9:
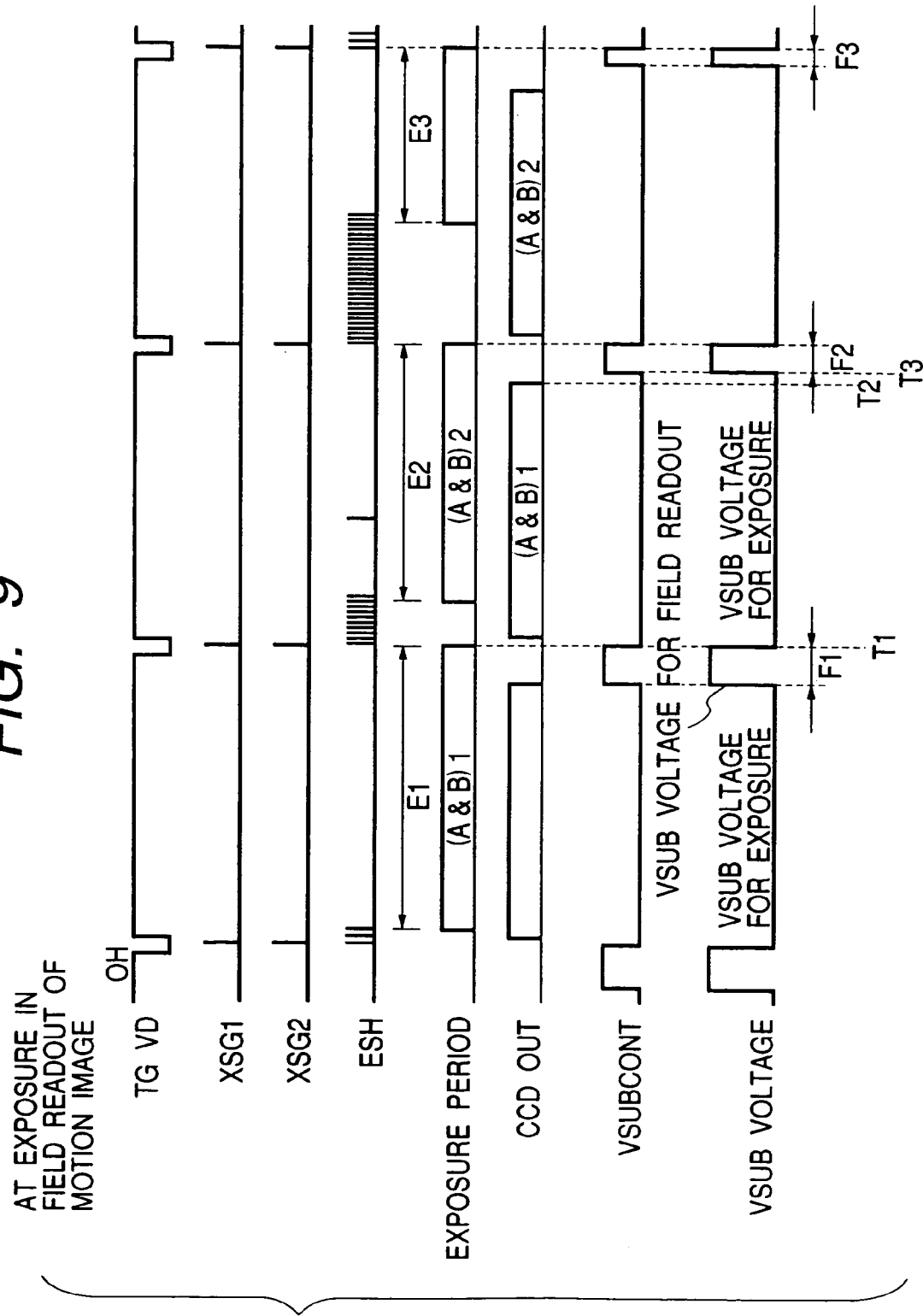
FIG. 9 is a chart showing the control timing in a second embodiment of the present invention.

Referring to FIG. 9, periods (A&B)1 and (A&B)2 for the CCD OUT indicate the signal readout periods of the image pickup element, and the substrate voltage is not changed during such period, because a change in the substrate voltage during such period generates a noise in the signal read out from the CCD.

In the present embodiment, the color change suppression means is constituted by the VSUB control circuit, which applies the substrate voltage corresponding to the exposure for the still image mode in a part of the exposure time (namely a period excluding the following exposure time F1, F2, F3) and also applies the field readout substrate voltage in a part (F1, F2, F3) of the exposure time, and varies such period (F1, F2, F3) according to the exposure time.

As explained in the foregoing, the embodiments 1 and 2 allow to obtain a same color reproducibility both in the field readout and in the frame readout. In the field readout and in the frame readout, the charge exceeding the accumulation charge amount of the vertical signal transfer channel can be discarded to the substrate of the image pickup apparatus prior to the signal transfer to such channel, thereby preventing the blooming phenomenon.

Also in a system where plural substrate different voltages are applied during reading the signal from the image pickup apparatus in continuous manner, there can be prevented the change in the sensitivity and the spectral sensitivity of the image pickup element even if the exposure time is changed.

Also it is rendered possible to prevent the difference in the spectral sensitivity among the signal continuously readout from the image pickup element, the field readout still image and the frame readout still image, thereby obtaining a same color reproducibility among the image obtained by continuous signal readout, the still image obtained by field readout and the still image obtained by frame readout.

In the following there will be explained a third embodiment of the present invention with reference to FIGS. 11A and 11B which are timing charts showing the feature of the present embodiment, respectively showing an exposure amount detecting operation and a still image exposure operation.

Referring to FIG. 11A, a substrate voltage VSUB_Fi is applied to the CCD 2 during a period V0 to V2 for an exposure amount detecting operation (in which the CCD 2 functions in the field readout mode), and the image exposed to the CCD 2 in a period V1 is read therefrom as an electrical signal in a period V2. The exposure conditions in the period V1 are defined by a diaphragm aperture F_1 of the mechanical shutter and the diaphragm means 10, an aperture value (Av_1) corresponding to the diaphragm aperture F_1, an exposure time T1 determined by the electronic shutter ESH and the readout pulse (XSG1, 2), a time value (Tv_1) corresponding to the exposure time T1, an amplifier gain (Gain_Fi) of the CDS circuit in the period V2, and a sensitivity value (Sv_1) with consideration of the CCD and the CDS circuit.

Also there is detected the exposure amount from the image signal read in the period V2, and, based on the result of such exposure amount detection, control is so executed as to determine an aperture value (Av_2), the exposure time value (Tv_2) and the amplifier gain (Gain_Fr) of the CDS circuit in the still image exposure operation (in which the CCD functions in the frame readout mode) under the application of a substrate voltage VSUB Fr to the CCD, so that the mechanical shutter and the diaphragm means 10 is controlled so as to obtain an aperture diameter F_2 corresponding to the aperture value (Av_2) and the electronic shutter, the mechanical shutter and the diaphragm means 10 are controlled so as to obtain an exposure time T2 corresponding to the exposure time value (Tv_2).

Figure 11B:
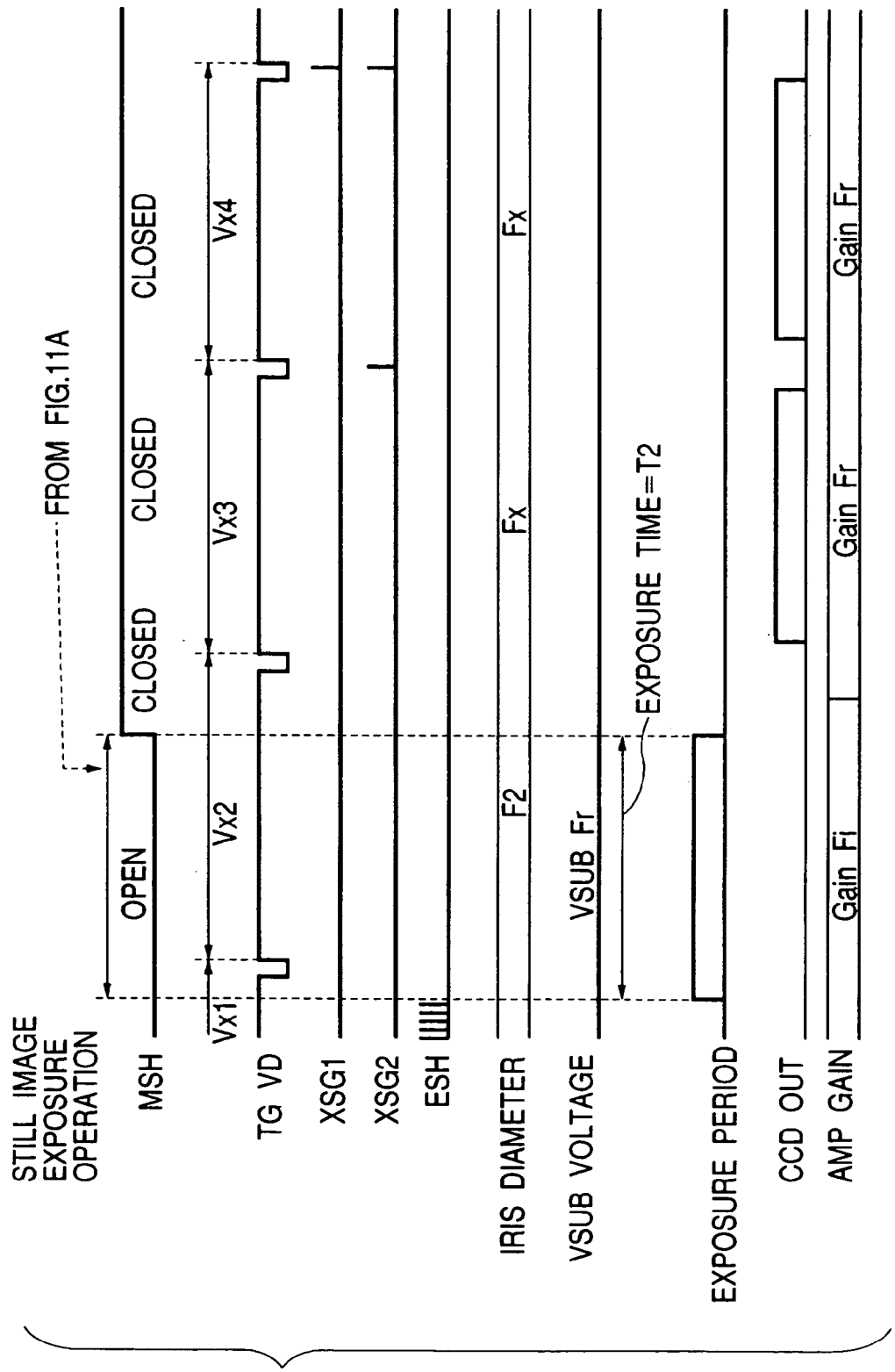
FIG. 11 which is composed of FIGS. 11A and 11B are charts showing the control timing in a third embodiment of the present invention.

Also in the determination of the still image exposure amount shown in FIG. 11B, in order to eliminate the influence of the repeating accuracy of mechanical control of the diaphragm, the diaphragm aperture is maintained same in the exposure amount detecting operation and the still image exposing operation (F_1=F_2) so that the aperture value is maintained same (Av_1=Av_2). As the substrate voltage VSUB applied to the CCD is different between the exposure amount detecting operation and the still image exposing operation, the sensitivity of the CCD becomes different and such difference in the sensitivity is taken as a sensitivity value Sv_α, which is measured in advance as a difference resulting from the difference in the substrate voltage and is stored in the memory 7 or the system controller 9 of the present system.

Following equations stand for the aperture value Av_1 corresponding to the diaphragm aperture F_1, aperture value Av_2 in the still image exposing operation and amplifier gain of the CDS circuit:

$$Av\_1+Tv\_1=Bv+Sv\_1:$$

(exposure condition for exposure amount detecting operation)

$$Av\_2+Tv\_2=Bv+Sv\_2:$$

(exposure condition for still image exposing operation)

$$Av\_1=Av\_2,$$

$$Gain\_Fr=\beta*Gain\_Fi$$

wherein Av_1 is an aperture corresponding to the diaphragm aperture F_1, Tv_1 is a time value corresponding to the exposure time T1, Bv is a luminance value of the object, Sv_1 is a sensitivity value with consideration of the CCD and the CDS circuit, Av_2 is an aperture value in the still image exposing operation, Tv_2 is an exposure time value, Sv_2 is a sensitivity value of the CCD in the still image exposing operation, Gain_Fr is an amplifier gain of the CDS circuit in the still image exposing operation, Gain_Fi is an amplifier gain of the CDS circuit in the exposure amount detecting operation, and β a ratio of the gain in the moving image exposing operation relative to that in the still image exposing operation.

Thus the sensitivity Sv_2 in the still image exposing operation and the exposure time value Tv_2 therein can be given:

$$Sv\_2 = Sv\_1 - Sv\_\alpha + \log2(\beta)$$

$$Tv\_2 = Tv\_1 - Sv\_1 + Sv\_2$$

$$= Tv\_1 - Sv\_\alpha + \log2(\beta)$$

An exposure time and an amplifier gain of the CDS circuit, giving the exposure time value Tv_2 determined from the foregoing equations, are set in the still image exposing operation whereby a same image luminance can be obtained in the still image exposure (in the frame readout mode) and in the exposure amount detecting operation (in the field readout mode). Thus, by setting the exposure time and the gain of the CDS circuit in the still image exposing operation based on the exposure amount detecting operation, there can be avoided the fluctuation in the level of the image signal between the above-mentioned two operations whereby an image signal of stable image quality can be obtained.

In the foregoing description, the field readout means a readout method giving one frame image by an odd field and an even field of interlaced scanning of the CCD. The frame readout still image is obtained by successive scanning of a frame, and the still image for higher definition is usually obtained by reading one frame. In the present embodiment, a moving image is obtained by field readout while a still image is obtained by frame readout, but such method is not restrictive and the frame readout may be adopted for the moving image. Also either method may be employed by increasing the vertical scanning frequency.

Also in the present embodiment, as explained in the foregoing, there are provided a still image operation mode in which a first substrate voltage is applied to the CCD 2 and a moving image operation mode in which a second substrate voltage is applied to the CCD 2 while the sensitivity difference of the CCD 2 between the still image operation mode and the moving image operation mode is stored in advance in the memory 7, and, in case of executing the exposure amount control by the output signal of the CCD 2 in the still image operation mode and in case of recording the output image information from the CCD 2 in the moving image operation mode in a video recording apparatus such as a VTR or a DVD, the result of exposure amount control utilizing the output signal of the CCD 2 in the still image operation mode is corrected by the sensitivity difference between the still image operation mode and the moving image operation mode, stored in the memory 7, for recording the output image information from the CCD 2 in the video recording apparatus, whereby the image level remains same as in the still image operation mode and there can be obtained an image stable in the image quality.

Also in the present embodiment, in a configuration including a CCD 2 adaptable to both a readout method by adding vertically arranged plural pixels and a readout method without such adding, an optical mechanism such as a lens or a zoom lens for introducing light into the CCD 2 or intercepting the light, an electronic shutter for controlling the exposure time of the CCD 2 in cooperation with the optical mechanism, a driver for driving the CCD 2, and a memory storing a sensitivity difference of the CCD 2 between a field readout image operation mode in which the CCD 2 is given a first substrate voltage, among plural substrate voltages, and is operated with addition of plural pixels at the readout, and a frame readout still image operation mode in which the CCD 2 is given a second substrate voltage, among such plural substrate voltages, and is operated without addition of plural pixels, in which the exposure amount is controlled by the output signal of the CCD 2 in the field readout image operation mode, wherein, in case of recording the output image information from the CCD 2 in the frame readout still image operation mode in the video recording apparatus, the result of the exposure amount control based on the output signal of the CCD 2 in the field readout image operation mode is corrected by the sensitivity difference between the field readout image operation mode and the frame readout still image operation mode, stored in the memory, whereby there can be absorbed the fluctuation in the image quality resulting from the difference in the scanning method.

In the following there will be explained a fourth embodiment of the present invention.

Figure 12:
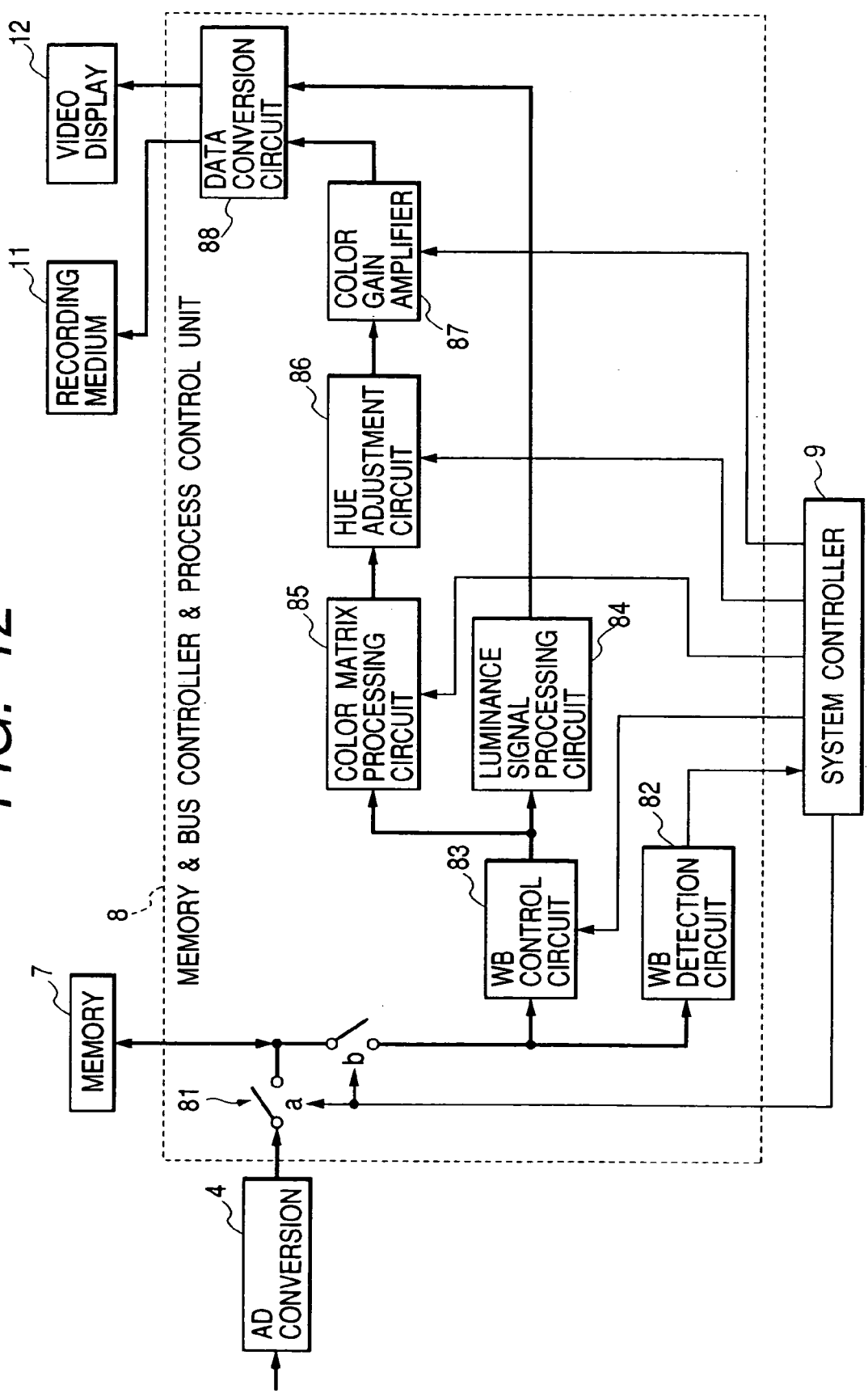
FIG. 12 is a chart showing the control timing in a fourth embodiment of the present invention.

FIG. 12 is a block diagram best representing the feature of the fourth embodiment and showing the configuration of the memory and bus controller/process unit 8 shown in FIG. 6 and peripheral circuits.

Referring to FIG. 12, a switch 81 controls the connection of the image signal. The image signal read from the CCD 2 is digitized in an AD converter 4. In the moving image operation mode (CCD 2 being in the field readout mode), the switches 81(*a*), (*b*) are both turned on, whereby the output of the AD converter 4 is transmitted to a white balance (WB) detection circuit 82 and a white balance control circuit 83. In the still image operation mode (CCD 2 being in the frame readout mode), the switches 81(*a*) and (*b*) are respectively turned on and off, for storing the image signal, read from the CCD 2 and digitized in the AD converter 4, in the memory 7, and then are respectively turned off and on to transmit the image signal from the memory 7 to the WB detection circuit 82 and the WB control circuit 83.

The switch 81, linked with the switching of the moving image operation and the still image operation, is composed of a semiconductor switch based on a MOSFET. However, it may also be composed of a mechanical switch utilizing a relay. The WB detection circuit 82 obtains data, necessary for attaining white balance, from the image signal, while the WB control circuit 83 discriminates whether a group of plural adjacent pixels in the input image signal represents white color, based on the output ratio of the plural color components contained in such group of pixels, and sends the result of discrimination to the system controller 9, wherein a color temperature range that can be covered by the white balance in the above-mentioned discriminating operation can be set by the system controller 9.

Also the WB control circuit 83 serves to attain the white balance of the image signal by receiving the coefficients for the color components, calculated in the system controller 9 according to the result of discrimination by the WB detection circuit 82 and multiplying the color components of the image signal with such coefficients.

In FIG. 12, there are also shown a luminance signal process circuit 84 for applying a predetermined process on the luminance signal in the output image signal from the WB control circuit 83; a color matrix process circuit 85 for generating predetermined plural color signals by multiplying desired gains on the plural color component signals contained in the image signal from the WB control circuit 83; a color hue adjustment circuit 86 for controlling the color hue of the color signals outputted from the color matrix process circuit 85; a color gain amplifier 87 for adjusting the color density by multiplying a gain on the color signals outputted from the color hue adjustment circuit 86; and a data conversion circuit 88 for converting the luminance signal from the luminance signal process circuit 84 and the color signals from the color gain amplifier 87 into data of a format matching the recording medium 11 and image display means 12.

In case the system of the present embodiment is operated in the moving image operation mode, the CCD 2 is operated in the field readout mode in which the plural pixels are added and outputted, and the CCD is given a substrate voltage VSUB_Fi suitable for the field readout mode.

Also in the still image operation mode, the CCD 2 is operated in the frame readout mode in which the plural pixels are not added, and the CCD is given a substrate voltage VSUB_Fr suitable for the frame readout mode.

The CCD 2 is provided with filters of plural colors, and, for example in case of complementary color filters (Mg, G, Ye, Cy: magenta, green, yellow, cyan), the CCD provides the following color outputs of an object in the still image operation mode:

$Mg(\lambda)+dm(\lambda)$, $G(\lambda)+dg(\lambda)$, $Ye(\lambda)+dy(\lambda)$, $Cy(\lambda)+dc(\lambda)$, wherein $\lambda$ is the spectral characteristics of the object, and $dm(\lambda)$, $dg(\lambda)$, $dy(\lambda)$ and $dc(\lambda)$ are sensitivity differences in the respective color pixels of magenta, green, yellow and cyan when the substrate voltage is changed from VSUB_Fi to VSUB_Fr.

Figure 13:
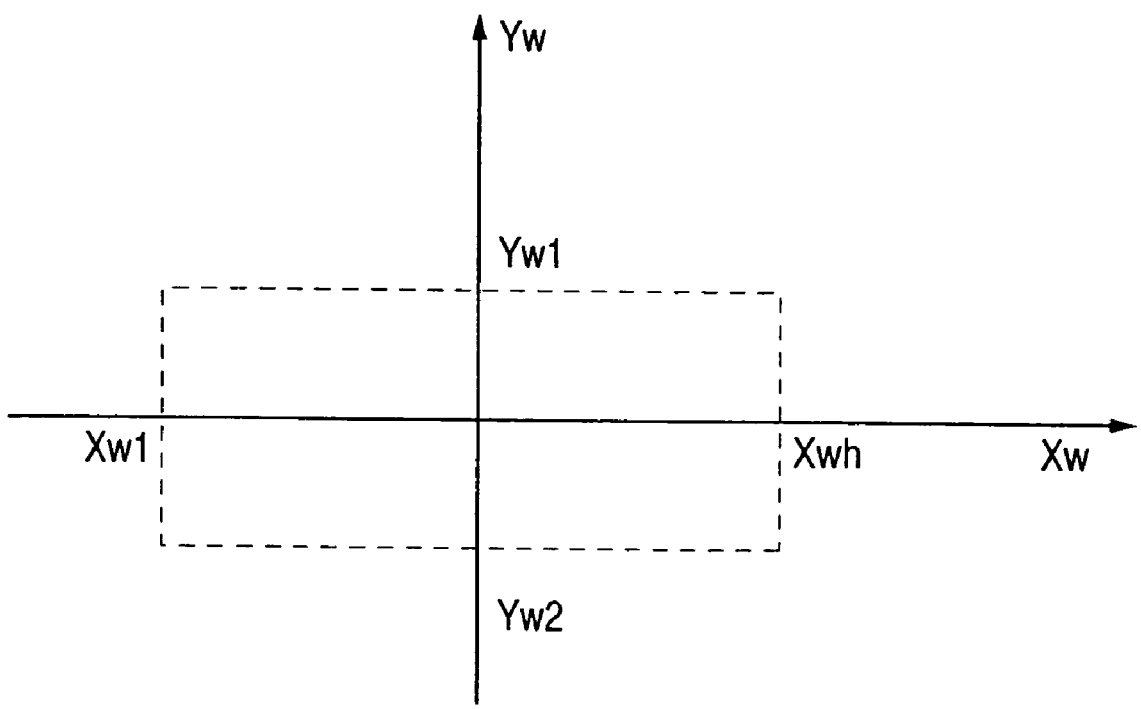
FIG. 13 is a chart showing the white color discrimination range of the present invention in a two-dimensional coordinate system.

Also in the moving image operation mode, the outputs of the CCD 2 for an object can be represented by:

$Wr(\lambda)=Mg(\lambda)+Ye(\lambda)$, $Gb(\lambda)=G(\lambda)+Cy(\lambda)$, $Wb(\lambda)=Mg(\lambda)+Cy(\lambda)$, $Gr(\lambda)=G(\lambda)+Ye(\lambda)$, The discrimination of white color is executed by setting a white color discrimination range, as shown in FIG. 13, on a two-dimensional coordinate system based on:

$Xw=(Ye-Cy)/(Mg+G+Ye+Cy)$ (abscissa)

$Yw=(Mg-G)/(Mg+G+Ye+Cy)$ (ordinate)

and judging whether the color component level of the adjacent plural pixels read from the CCD 2 is within the white discrimination range on the above-mentioned coordinate system.

In FIG. 13, the white discrimination range is defined by Xw1, Xwh, Yw1, Yw2, and in consideration of the white balance tracking range of ($\lambda 0w$ to $\lambda Xw$), the white color range is given by the following output color components of the CCD 2 in the still image operation mode, in consideration of the sensitivity difference for the respective colors for the change of VSUB:

{$Mg(\lambda 0w)+dm(\lambda 0w)$ to $Mg(\lambda xw)+dm(\lambda xw)$,
  $G(\lambda 0w)+dg(\lambda 0w)$ to $G(\lambda xw)+dg(\lambda xw)$,
  $Ye(\lambda 0w)+dy(\lambda 0w)$ to $Ye(\lambda xw)+dy(\lambda xw)$,
  $Cy(\lambda 0w)+dc(\lambda 0w)$ to $Cy(\lambda xw)+dc(\lambda xw)$}.

When this is applied to the white color discrimination range shown in FIG. 13, and Xw1#s and Xwh#s which are values of Xw1 and Xwh in the still image operation mode can be represented as:

$Xw1\#s=\{Ye(\lambda 0w)+dy(\lambda 0w)-Cy(\lambda 0w)-dc(\lambda 0w)\}/Z0$ $Xwh\#s=\{Ye(\lambda xw)+dy(\lambda xw)-Cy(\lambda xw)-dc(\lambda xw)\}/Zx$ It is also assumed that:

$Z0=\{Mg(\lambda 0w)+dm(\lambda 0w)+G(\lambda 0w)+dg(\lambda 0w)+Ye(\lambda 0w)+dy(\lambda 0w)+Cy(\lambda 0w)+dc(\lambda 0w)\}$ $Zx=\{Mg(\lambda xw)+dm(\lambda xw)+G(\lambda xw)+dg(\lambda xw)+Ye(\lambda xw)+dy(\lambda xw)+Cy(\lambda xw)+dc(\lambda xw)\}$ Also in the moving image operation mode, the following values:

{$Wr(\lambda 0w)$ to $Wr(\lambda xw)$, $Gb(\lambda 0w)$ to $Gb(\lambda xw)$,
  $Wb(\lambda 0w)$ to $Wb(\lambda xw)$, $Gr(\lambda 0w)$ to $Gr(\lambda xw)$} are applied to the white discrimination range, and Xw1#m and Xwh#m, which are the values of Xw1 and Xwh in the moving image operation mode, can be represented as:

$$Xw1\#m = \{Wr(\lambda 0w) - Wb(\lambda 0w)\}/\{Wr(\lambda 0w) + Gb(\lambda 0w)\}$$
$$= \{Ye(\lambda 0w) - Cy(\lambda 0w)\}/\{Mg(\lambda 0w) + G(\lambda 0w) + Ye(\lambda 0w) + Cy(\lambda 0w)\}$$

$$Xwh\#m = \{Wr(\lambda xw) - Wb(\lambda xw)\}/\{Wr(\lambda xw) + Gb(\lambda xw)\}$$
$$= \{Ye(\lambda xw) - Cy(\lambda xw)\}/\{Mg(\lambda xw) + G(\lambda xw) + Ye(\lambda xw) + Cy(\lambda xw)\}$$

The foregoing equations indicate that the white color discrimination range, corresponding to the tracking range $\lambda 0w$ to $\lambda xw$ has to be changed in the still image operation mode and in the moving image operation mode.

Thus, in the still image operation mode, there is adopted a white color discrimination range in consideration of the sensitivity difference {$dm(\lambda)$, $dg(\lambda)$, $dy(\lambda)$, $dc(\lambda)$} resulting from the change in the VSUB voltage, and, in the moving image operation mode, the white color discriminate range is set without considering such sensitivity difference.

The WB control circuit 83 attains the white balance by multiplying the white balance coefficients, calculated in the system controller 9 based on the result received from the WB detection circuit 82, on the respective color components of the image signal.

The output values of the WB control circuit 83 representing the white color under a given light source in the still image operation mode are represented as follows, including the white balance coefficients and in consideration of the sensitivity difference of the pixels caused by the change in the substrate voltage of the CCD:

$$km*\{Mg(\lambda nw) + dm(\lambda nw)\}$$
$$= kg*\{G(\lambda nw) + dg(\lambda nw)\}$$
$$= ky*\{Ye(\lambda nw) + dy(\lambda nw)\}$$
$$= kc*\{Cy(\lambda nw) + dc(\lambda nw)\}$$

wherein km, kg, ky and kc are white balance coefficients.

Also in the moving image operation mode, there are provided the following signals including the white balance coefficients:

$$kwr * Wr(\lambda nw)$$
$$= kgb * Gb(\lambda nw)$$
$$= kwb * Wb(\lambda nw)$$
$$= kgr * Gr(\lambda nw)$$

wherein kwr, kgb, kwb and kgr are white balance coefficients.

The color matrix circuit 85 converts the output signals from the WB control circuit 83 into predetermined signal components by multiplying coefficients on the color components of such output signals. For example, conversion into a luminance signal Y and two color difference signals Cr, Cb, in the still image operation mode, is achieved by:

$$Y = a11 * km * (Mg(\lambda) + dm(\lambda)) +$$
$$a12 * kg * (G(\lambda) + dg(\lambda)) +$$
$$a13 * ky * (Ye(\lambda) + dy(\lambda)) +$$
$$a14 * kc * (Cy(\lambda) + dc(\lambda))$$
$$Cr = a21 * km * (Mg(\lambda) + dm(\lambda)) +$$
$$a22 * kg * (G(\lambda) + dg(\lambda)) +$$
$$a23 * ky * (Ye(\lambda) + dy(\lambda)) +$$
$$a24 * kc * (Cy(\lambda) + dc(\lambda))$$
$$Cb = a31 * km * (Mg(\lambda) + dm(\lambda)) +$$
$$a32 * kg * (G(\lambda) + dg(\lambda)) +$$
$$a33 * ky * (Ye(\lambda) + dy(\lambda)) +$$
$$a34 * kc * (Cy(\lambda) + dc(\lambda))$$

under conditions:

$$a11+a12=a21+a22=a31+a32,$$
$$a13+a14=a33+a34$$

wherein a11 to a34 are matrix coefficients.

In the moving image operation mode, the color pixels of the CCD are read with pixel addition and the sensitivity difference in the respective color pixels resulting from the change in VSUB is included in the consideration. Therefore, the conversion into the luminance signal Y and the two color difference signals Cr, Cb is achieved by:

$$Y = b11 * (kwr * Wr(\lambda)) +$$
$$b12 * (kgb * Gb(\lambda)) +$$
$$b13 * (kwb * Wb(\lambda)) +$$
$$b14 * (kgr * Gr(\lambda))$$
$$Cr = b21 * (kwr * Wr(\lambda)) +$$
$$b22 * (kgb * Gb(\lambda)) +$$
$$b23 * (kwb * Wb(\lambda)) +$$
$$b24 * (kgr * Gr(\lambda))$$
$$Cb = b31 * (kwr * Wr(\lambda)) +$$

-continued
$$b32 * (kgb * Gb(\lambda)) +$$
$$b33 * (kwb * Wb(\lambda)) +$$
$$b34 * (kgr * Gr(\lambda))$$

under conditions:

$$b11+b12=b21+b22=b31+b32,$$
$$b13+b14=b33+b34$$

wherein b11 to b34 are matrix coefficients.

The aforementioned conditions are given for suppressing the color moiree in the vertical direction.

The above-mentioned matrix coefficients (a11 to a34 in the still image operation mode or b11 to b34 in the moving image operation mode) are so set as to optimize the color reproducibility. The calculation is easier in the moving image operation mode, since the sensitivity difference {dm($\lambda$), dg($\lambda$), dy($\lambda$), dc($\lambda$)} resulting from the change in the VSUB voltage is not involved.

However, the reproducibility of all the object colors cannot be maintained same in the still image operation mode and in the moving image operation mode, because of the sensitivity difference {dm($\lambda$), dg($\lambda$), dy($\lambda$), dc($\lambda$)} resulting from the VSUB change and of the difference in the white balance coefficients (km, kg, ky, kc for the still image and kwr, kgb, kwb, kgr for the moving image) influenced by the sensitivity difference.

Therefore, in order to obtain the similar color reproducibility in the still image and in the moving image, the color hue adjustment circuit 86 executes correction of the phase relationship difference {c11, c12, c21, c22} of the two color difference signals, obtained from the color matrix circuit, by a matrix operation represented by:

$$R-Y=c11*Cr+c12*Cb$$
$$B-Y=c21*Cr+c22*Cb$$

thereby improving the color reproducibility. The matrix coefficients {c11 c12, c21, c22} can be determined by observing the reproduced image and taking into consideration the configuration of the present system, the visual characteristics and the acceptable range for the image of human being.

As explained in the foregoing, the substrate voltage applied to the CCD 2 is different in the still image operation mode and in the moving image operation mode, thereby causing a change in the spectral characteristics of the pixels of different colors, and the spectral characteristics of the color filters, the color of the object and the color of the light source are added to such change. Therefore, the color reproduction by the output signals Cr, Cb from the color matrix circuit 85 becomes different in the still image and in the moving image, and such difference is corrected by varying the matrix coefficients (c11, c12, c21, c22) of the color hue adjustment circuit 86 according to the applied substrate voltage, thereby obtaining the optimum color reproduction.

In the present embodiment, in a configuration including a CCD 2 provided with plural color filters, an optical mechanism such as a lens or a zoom lens for introducing light into the CCD 2 or intercepting the light, an electronic shutter for controlling the exposure time of the CCD 2 in cooperation with the optical mechanism, a driver for driving the CCD 2, a substrate voltage generator for applying plural substrate voltages to the CCD 2, and a white balance circuit for attaining the white balance in the image signal outputted from the CCD 2 in a still image operation mode in which a first substrate voltage, among plural substrate voltages, is applied to the CCD 2 and in a moving image operation mode in which a second substrate voltage is applied to the CCD 2, in which the white balance circuit includes setting means for detecting the color component ratio of the output signal of the CCD 2 and setting a white color extraction range according to such color component ratio, wherein a first white extraction range is set in the white balance circuit in case the CCD 2 is operated in the still image operation mode, and a second white extraction range is set in case the CCD 2 is operated in the moving image operation mode. The setting of such first and second white extraction ranges allows to obtain an image signal excellent in the color reproducibility, both in the still image and in the moving image.

Also the foregoing embodiment allows to obtain the image signal excellent in the color reproducibility and to store the image signal for example by video recording, even in case the CCD 2 is adapted for a readout method with addition of plural pixels as in the case of moving image pickup and a readout method without addition of plural pixels as in the still image pickup.

Also for adjusting the color hue of the two color signals in the still and moving images in the foregoing embodiment, the matrix coefficients of the color hue adjustment circuit 86 are set as first color hue adjustment values in case the CCD 2 is operated in the still image operation mode and as second color hue adjustment values in case the CCD 2 is operated in the moving image operation mode, whereby obtained is an image signal with optimum color reproducibility. Such image signal can be recorded for example in an image recording apparatus, thereby providing images without fluctuation in the still image and in the moving image.

Also in case of image pickup with a sensor such as the CCD 2 adapted both for a readout method for a still image with addition of plural pixels arranged in the vertical direction of the CCD 2 having plural color filters and for a readout for a moving image without addition of plural pixels, the matrix coefficients of the color hue adjustment circuit 86 are set as first color hue adjustment values in case the CCD 2 is operated in the still image operation mode and as second color hue adjustment values in case the CCD 2 is operated in the moving image operation mode, whereby obtained is an image signal with optimum color reproducibility.

The foregoing embodiment has been explained for a case of employing the white balance detection circuit 82 and the white balance control circuit 83 corresponding to the complementary color filters (Mg, G, Ye, Cy), but the present invention is likewise applicable to a case of employing primary color filters (R, G, B) in the CCD 2. Also in the foregoing description, the green filter is used as a complementary color filter, but the white balance signal process is often executed on the magenta, yellow and cyan signals, excluding the green signal. The foregoing embodiment is applicable also to such case, under the same basic technical concept.

As explained in the foregoing, the third and fourth embodiments enable appropriate exposure amount control in the operation states with different substrate voltages.

Also there can be attained appropriate white balance and color reproduction even in the operation states with different substrate voltages.

Furthermore, there can be obtained appropriate color reproduction even in the operation states with different substrate voltages.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image processing apparatus comprising:
   a signal processing unit, adapted to process a signal from an image pickup element; and
   a control unit, adapted to control said signal processing unit so as to suppress an affect on an image caused by a difference in sensitivity of said image pickup element between a first mode and a second mode;
   wherein, in the first mode said image pickup element is driven while applying a first substrate voltage to said image pickup element, and in the second mode said image pickup element is driven while applying a second substrate voltage different from the first substrate voltage, to said image pickup element.

2. An apparatus according to claim 1, wherein said control unit suppresses a difference between color reproducibility of a first image which is based on the signal output from said image pickup element in the first mode, and color reproducibility of a second image which is based on the signal output from said image pickup element in the second mode.

3. An apparatus according to claim 1, wherein said control unit effects control so as to perform exposure control on the basis of a correction value and the signal output from said image pickup element in the first mode and perform photographing with said image pickup element in the second mode under the exposure condition obtained by the exposure control, and wherein the correction value is a suppression correction value of the affect on the image, caused by the difference in the sensitivity of said image pickup element between the first mode and the second mode.

4. An image processing apparatus comprising:
   an image pickup element;
   a substrate voltage control unit, adapted to apply selectively a first substrate voltage and a second substrate voltage different from the first substrate voltage, to said image pickup element;
   a drive control unit, adapted to control selectively a first mode in which said image pickup element is driven while applying the first substrate voltage to said image pickup element, and a second mode in which said image pickup element is driven while applying the second substrate voltage to said image pickup element; and
   a control unit, adapted to effect control so as to suppress an affect on an image caused by a difference in sensitivity of said image pickup element between the first mode and the second mode.

5. An apparatus according to claim 4, wherein said control unit suppresses a difference between color reproducibility of a first image which is based on the signal output from said image pickup element in the first mode, and color reproducibility of a second image which is based on the signal output from said image pickup element in the second mode.

6. An apparatus according to claim 4, wherein said control unit effects control so as to perform exposure control on the basis of a correction value and the signal output from said image pickup element in the first mode and perform photographing with said image pickup element in the second mode under the exposure condition obtained by the exposure control, and wherein the correction value is a suppression correction value of the affect on the image, caused by the difference in the sensitivity of said image pickup element between the first mode and the second mode.

7. An apparatus according to claim 6, wherein in the first mode, a plurality of signals of said image pickup element are added to each other therein and then read out from said image pickup element in a form of an added signal, and in the second mode, the plurality of signals of said image pickup element are not subjected to addition therein and read out from said image pickup element in a form of a non-added signal.

8. An apparatus according to claim 7, wherein said image pickup element effects motion image photographing in the first mode, and effects still image photographing in the second mode.

9. An image processing apparatus comprising:
a signal processing unit, adapted to process a first signal and a second signal, from an image pickup element, wherein the first signal is a signal obtained from said image pickup element in a first mode in which said image pickup element is driven while applying a first substrate voltage to said image pickup element, and the second signal is a signal obtained from said image pickup element in a second mode in which said image pickup element is driven while applying a second substrate voltage different from the first substrate voltage, to said image pickup element; and
a control unit, adapted to suppress a difference between color reproducibility of a first image which is based on the first signal output from said image pickup element in the first mode, and color reproducibility of a second image which is based on the second signal output from said image pickup element in the second mode.

10. An apparatus according to claim 9, wherein said signal processing unit includes a white balance adjustment unit, adapted to adjust white balance of each of the first and second signals from said image pickup element, and wherein said control unit controls said white balance adjustment unit to suppress the difference in the color reproducibility between the first and second signals.

11. An apparatus according to claim 10, wherein said white balance adjustment unit includes a white balance detection unit, adapted to detect a signal which is estimated to be representative of a color of white, from the signals output from said image pickup element, and a white balance control unit, adapted to adjust the first and second signals from said image pickup element on the basis of a detection result of said white balance detection unit, and wherein said control unit controls said white balance control unit so as to suppress the difference in the color reproducibility between the first and second signals.

12. An apparatus according to claim 9, wherein in the first mode, a plurality of signals of said image pickup element are added to each other therein and then read out from said image pickup element in a form of an added signal, and in the second mode, the plurality of signals of said image pickup element are not subjected to addition therein and read out from said image pickup element in a form of a non-added signal.

13. An apparatus according to claim 9, wherein said image pickup element effects motion image photographing in the first mode, and effects still image photographing in the second mode.

14. An image processing apparatus comprising:
an image pickup element;
a substrate voltage control unit, adapted to apply selectively a first substrate voltage and a second substrate voltage different from the first substrate voltage to said image pickup element;
a drive control unit, adapted to control selectively a first mode in which said image pickup element is driven while applying the first substrate voltage to said image pickup element, and a second mode in which said image pickup element is driven while applying the second substrate voltage to said image pickup element; and
a control unit, adapted to suppress a difference between color reproducibility of a first image which is based on the signal output from said image pickup element in the first mode, and color reproducibility of a second image which is based on the signal output from said image pickup element in the second mode.

15. An image processing method comprising:
a control step, of effecting control so as to suppress an affect on an image, caused by a difference in sensitivity of an image pickup element between a first mode and a second mode;
wherein, in the first mode said image pickup element is driven while applying a first substrate voltage to said image pickup element, and in the second mode said image pickup element is driven while applying a second substrate voltage different from the first substrate voltage, to said image pickup element.

16. An image processing method comprising:
a control step, of effecting control so as to suppress a difference between color reproducibility of a first image which is based on a first signal output from an image pickup element in a first mode, and color reproducibility of a second image which is based on a second signal output from said image pickup element in a second mode,
wherein, in the first mode said image pickup element is driven while applying a first substrate voltage to said image pickup element, and in the second mode said image pickup element is driven while applying a second substrate voltage different from the first substrate voltage, to said image pickup element.

* * * * *

UNITED STATES PATENT AND TRADEMARK OFFICE
CERTIFICATE OF CORRECTION

PATENT NO. : 7,161,625 B2
APPLICATION NO. : 11/104475
DATED : January 9, 2007
INVENTOR(S) : Masashi Hori It is certified that error appears in the above-identified patent and that said Letters Patent is hereby corrected as shown below:

ON THE TITLE PAGE ITEM (56) REFERENCES CITED:

Foreign Patent Documents, "JP 7-93706 9/1989" should read --JP 1-93706 9/1989--.

ON THE TITLE PAGE ITEM (73) ASSIGNEE:

Assignee, "Canon Kabushiki Kaishi, Tokyo (JP)" should read --Canon Kabushiki Kaisha, Tokyo (JP)--.

IN THE DRAWINGS SHEET 6:

Figure 6, "COVERSION" should read --CONVERSION--.

COLUMN 1:

Line 27, "method" should read --methods--.

COLUMN 2:

Line 16, "resulting" should read --resulting in--.

COLUMN 3:

Line 55, "is" should read --of--.

COLUMN 9:

Line 49, "readout" should read --read out--.

COLUMN 16:

Line 43, "c11 c12," should read --c11, c12--.

UNITED STATES PATENT AND TRADEMARK OFFICE
CERTIFICATE OF CORRECTION

PATENT NO. : 7,161,625 B2
APPLICATION NO. : 11/104475
DATED : January 9, 2007
INVENTOR(S) : Masashi Hori It is certified that error appears in the above-identified patent and that said Letters Patent is hereby corrected as shown below:

COLUMN 18:

Line 15, "affect" should read --effect--;
Line 37, "affect" should read --effect--; and
Line 54, "affect" should read --effect--.

COLUMN 19:

Line 3, "affect" should read --effect--.

COLUMN 20:

Line 31, "affect" should read --effect--.

Signed and Sealed this

Sixteenth Day of September, 2008

JON W. DUDAS
*Director of the United States Patent and Trademark Office*